(12) United States Patent
Yoneda

(10) Patent No.: US 7,777,242 B2
(45) Date of Patent: Aug. 17, 2010

(54) LIGHT EMITTING DEVICE AND FABRICATION METHOD THEREOF

(75) Inventor: Akinori Yoneda, Anan (JP)

(73) Assignee: Nichia Corporation, Anan-shi, Tokushima (JP)

( * ) Notice: Subject to any disclaimer, the term of this patent is extended or adjusted under 35 U.S.C. 154(b) by 545 days.

(21) Appl. No.: 11/730,335

(22) Filed: Mar. 30, 2007

(65) Prior Publication Data

US 2007/0228393 A1    Oct. 4, 2007

(30) Foreign Application Priority Data

Mar. 31, 2006  (JP)  ............... 2006-100703
Mar. 1, 2007   (JP)  ............... 2007-052066

(51) Int. Cl.
  *H01L 29/22*  (2006.01)
  *H01L 29/26*  (2006.01)

(52) U.S. Cl. ............... 257/98; 257/79; 257/91; 257/95

(58) Field of Classification Search ............ 257/79, 257/81, 91, 95, 98, 99, E33.074
See application file for complete search history.

(56) References Cited

U.S. PATENT DOCUMENTS 6,495,862 B1 * 12/2002 Okazaki et al. ............ 257/103
7,075,115 B2   7/2006  Sakamoto et al.
7,514,720 B2 * 4/2009  Kim et al. ................. 257/90
7,518,153 B2 * 4/2009  Usuda et al. ............... 257/94

FOREIGN PATENT DOCUMENTS

| JP | 2001-024222 | 1/2001 |
| JP | 2002-016282 | 1/2002 |
| JP | 2003-051610 | 2/2003 |
| JP | 2004-221529 | 8/2004 |

* cited by examiner

*Primary Examiner*—Hung Vu
(74) *Attorney, Agent, or Firm*—Squire, Sanders & Dempsey L.L.P.

(57) ABSTRACT

A light emitting device which includes: a substrate; an n-type semiconductor layer which is composed of a nitride semiconductor, formed on the substrate and has an n-side electrode; a p-type semiconductor layer which is composed of a nitride semiconductor, and stacked above the n-type semiconductor layer; a light emitting layer which is disposed between the n-type semiconductor layer and the p-type semiconductor layer; a p-side electrode which is disposed on a transparent electrode formed on the p-side electrode in a light emitting area; a plurality of protrusions and depressions in an area other than the light emitting area; and an insulation film on an area except areas of the n-side electrode and the p-side electrode, wherein the n-side electrode and the p-side electrode are arranged on a same side of the substrate, wherein a thickness of the insulation film on a top of the protrusions and depressions is thicker than a thickness of the insulation film in the light emitting area.

15 Claims, 12 Drawing Sheets

(a)

(b)

LIGHT EMITTING DEVICE AND FABRICATION METHOD THEREOF

CROSS REFERENCE TO RELATED APPLICATIONS

This application claims the foreign priority benefit under Title 35, United States Code, §119(a)-(d) of Japanese Patent Application No. 2006-100703, filed on Mar. 31, 2006, and 2007-052066, filed on Mar. 1, 2007, the contents of which are hereby incorporated by reference.

FIELD OF THE INVENTION

The present invention relates to a light emitting device which includes a stack structure composed of nitride semiconductors and a fabrication method of the light emitting device.

DESCRIPTION OF THE RELATED ART

A light emitting device which includes nitride semiconductors in a stack structure, such as a high intensity pure green LED (Light Emitting Diode) and a blue LED, is used in various fields of, for example, a full-color LED display, a traffic signal light, and a backlight.

Generally, these LED have a structure in which an n-type nitride semiconductor layer, a light emitting layer, and a p-type nitride semiconductor layer are sequentially stacked on a substrate, such as a sapphire substrate. In addition, a p-side electrode (hereinafter, referred to as p-electrode) is arranged on the p-type nitride semiconductor, and an n-side electrode (hereinafter, referred to as n-electrode) is arranged on the n-type nitride semiconductor. Here, when the p-electrode and the n-electrode are arranged on a same surface side, the p-electrode is arranged on the p-type nitride semiconductor layer, while the n-electrode is arranged on the n-type nitride semiconductor layer which is exposed by, for example, etching off the p-type nitride semiconductor layer, the light emitting layer, and a part of the n-type nitride semiconductor layer. In addition, electrically conductive members such as wires made of, for example, a gold wire and various kinds of solders are bonded on each of the electrodes for conducting electric current. Various kinds of electrode arrangements for the above LED have been proposed before now. Also, various kinds of structures for the LED have been proposed for improving a light extraction efficiency.

For example, a light emitting device described in Japanese Laid-open Patent Publication No. 2001-24222 (Paragraphs 0021 to 0032, FIG. 1 and FIG. 2) is designed to increase a total light emitting efficiency by extracting a light, which propagates in a semiconductor layer in a light emitting area in a lateral direction, outside the light emitting device from a plurality of protrusions which are disposed in the light emitting area.

A light emitting device described in Japanese Laid-open Patent Publication No. 2004-221529 (Paragraphs 0076 to 0094, FIG. 11) is designed to increase a light emitting efficiency by extracting a light, which propagates in a semiconductor layer from a light emitting area in a lateral direction, outside the light emitting device from a plurality of protrusions and depressions which are disposed outside the light emitting area.

In addition, a light emitting device described in Japanese Laid-open Patent Publication No. 2003-51610 (Paragraphs 0010 to 0012, FIG. 1) is designed to reduce a non-uniform light intensity by forming an oblique surface by disposing a groove on an outer periphery of a light emitting area, thereby reflecting a light upward which is radiated in a lateral direction from a side of the light emitting device.

A light emitting device described in Japanese Laid-open Patent Publication No. 2002-16282 (Paragraphs 0022 to 0023, FIG. 3) is designed to reduces a light intensity of a light which propagates in a lateral direction, by disposing a groove on an outer periphery of a light emitting area and forming an insulator layer on an inner wall of the groove, while filling the groove with another insulator material which has a different refractive index from the insulator layer, thereby diffusing the light which propagates in a semiconductor layer from the light emitting area in the lateral direction and radiates from a side of the light emitting device.

However, in the light emitting device described in the Japanese Laid-open Patent Publication No. 2001-24222, since the concave portions are disposed in the light emitting area, the light emitting area decreases as much the area as corresponding to the disposed concave portions. In addition, when openings are formed in the light emitting area, a device performance becomes worse due to, for example, increase in a resistance of the LED.

In the light emitting device described in the Japanese Laid-open Patent Publication No. 2004-221529, since a height of disposed protrusions and depressions from the substrate surface and a height of the semiconductor layer of the light emitting area are identical to each other, it has been not always sufficient to reflect a light which is radiated from the side of the light emitting device in an observation surface direction.

In the light emitting device described in the Japanese Laid-open Patent Publication No. 2003-51610, since the wide groove is disposed outside the light emitting area, a chip size of the light emitting device becomes large.

In the light emitting device described in the Japanese Laid-open Patent Publication No. 2002-16282, the purpose of the invention is to reduce the light intensity which propagates in the lateral direction by diffusing the light radiated from the side of the light emitting device, and not to efficiently reflect the light in an observation surface direction.

The present invention has been developed for solving the above problems. Therefore, it would be desirable to provide a light emitting device and a fabrication method thereof, which increase light extraction efficiency in the observation surface direction.

SUMMARY OF THE INVENTION

According to a first aspect of the present invention, there is provided a light emitting device in which an n-type semiconductor layer which is composed of nitride semiconductors and has an n-side electrode, and a p-type semiconductor layer which is composed of nitride semiconductors are stacked on a substrate. A light emitting layer is disposed between the n-type semiconductor layer and the p-type semiconductor layer. A p-side electrode is disposed on the p-type semiconductor layer through a transparent electrode which is formed in a light emitting area. The n-side electrode and the p-side electrode are arranged on a same side of the substrate. The light emitting device includes: a plurality of protrusions and depressions in an area other than the light emitting area; and an insulation film on an area except areas of the n-side electrode and the p-side electrode, wherein a thickness of the insulation film on a top of the protrusions and depressions is thicker than a thickness of the insulation film on the light emitting area.

In the above configuration, since the thickness of the insulation film on the top of the plurality of protrusions and depressions, which are provided in the area surrounding the light emitting area other than the light emitting area, is formed to be thicker than that in the light emitting area, an amount of effective light to be extracted outside can be increased due to reflection of the light, which is radiated from the side of the light emitting area, by the insulation film.

In addition, the insulation film to be formed in the light emitting area can be configured with a film thickness as a conventional passivation film.

According to a second aspect of the present invention, there is provided a light emitting device in which an n-type semiconductor layer which is composed of nitride semiconductors and has an n-side electrode, and a p-type semiconductor layer which is composed of nitride semiconductors are stacked on a substrate. A light emitting layer is disposed between the n-type semiconductor layer and the p-type semiconductor layer. A p-side electrode is disposed on the p-type semiconductor layer through a transparent electrode which is formed in a light emitting area. The n-side electrode and the p-side electrode are arranged on a same side of the substrate. The light emitting device includes: a plurality of protrusions and depressions on an area other than the light emitting area; and an insulation film on an area except areas of the n-side electrode and the p-side electrode, wherein a thickness of the insulation film on a top of the protrusions and depressions is thicker than thicknesses of the insulation film on a bottom and on a side wall of the protrusions and depressions.

According to the above configuration, since the thickness of the insulation film on the top of the plurality of protrusions and depressions, which are provided in the area surrounding the light emitting area other than the light emitting area, is formed to be thicker than that on the bottom and side wall of the protrusions and depressions, an amount of effective light to be extracted outside can be increased due to reflection of the light, which is radiated from the side of the light emitting area, by the insulation film.

In addition, the insulation film to be formed on the bottom and side wall of the protrusions and depressions can be configured with a film which has a thickness as a conventional passivation film.

According to a third aspect of the present invention, there is provided a light emitting device in which an n-type semiconductor layer which is composed of nitride semiconductors and has an n-side electrode, and a p-type semiconductor layer which is composed of nitride semiconductors are stacked on a substrate. A light emitting layer is disposed between the n-type semiconductor layer and the p-type semiconductor layer. A p-side electrode is disposed on the p-type semiconductor layer through a transparent electrode which is formed in a light emitting area. The n-side electrode and the p-side electrode are arranged on a same side of the substrate. The light emitting device includes: a plurality of protrusions and depressions on an area other than the light emitting area; and an insulation film on an area except areas of the n-side electrode and the p-side electrode, wherein a thickness of the insulation film on a top of the protrusions and depressions is thicker than thicknesses of the insulation film in the light emitting area, and on a bottom and on a side wall of the protrusions and depressions.

In the above configuration, since the thickness of the insulation film on the top of the plurality of protrusions and depressions, which cover the area surrounding the light emitting area other than the light emitting area, is formed to be thicker than that in the light emitting area and that on the bottom and side wall of the protrusions and depressions, an amount of effective light to be extracted outside can be increased due to reflection of the light, which is radiated from the side of the light emitting area, by the insulation film.

In addition, the insulation film which is formed in the light emitting area and on the bottom and side wall of the protrusions and depressions, that is, in an area other than the top of the protrusions and depressions, can be configured with a film thickness as a conventional passivation film.

According to a fourth aspect of the present invention, there is provided a light emitting device, in which a height of the top of the protrusions and depressions from an upper surface of the substrate is higher than a height of the light emitting layer from the upper surface of the substrate.

In the above configuration, since the height of the top of the protrusions and depressions is higher than that of the light emitting layer, an amount of effective light to be extracted outside can be increased due to effective reflection of the light, which is radiated from the side of the light emitting area, in the observation surface direction by the side wall of the protrusions and depressions.

According to a fifth aspect of the present invention, there is provided a light emitting device, in which the insulation film on the top of the protrusions and depressions has a stacked structure which is configured by stacking a first insulation film which is formed on the p-type semiconductor layer and a second insulation film which covers the first insulation film.

In the above configuration, since the top of the protrusions becomes higher, the light which is radiated from the side of the light emitting area is effectively reflected in the observation surface direction by the protrusions. As a result, an amount of effective light to be extracted outside can be increased.

According to a sixth aspect of the present invention, there is provided a light emitting device, in which a height of a bottom of the protrusions and depressions from an upper surface of the substrate is lower than a height of the light emitting layer from the upper surface of the substrate.

In the above configuration, since the height of the bottom of the protrusions and depressions is lower than the light emitting layer, an amount of effective light to be extracted outside can be increased due to effective reflection of the light, which is radiated from the side of the light emitting area, in the observation surface direction by the side wall of the protrusions and depressions.

According to a seventh aspect of the present invention, there is provided a light emitting device, in which a cross section of a protrusion configuring the protrusions and depressions is a trapezoid which gradually becomes narrower toward a p-type semiconductor layer side from an n-type semiconductor layer side.

In the above configuration, since the side of the protrusions and depressions is formed in a trapezoid which is tapered to become narrower toward an upper surface, the light which is radiated from the side of the light emitting area is effectively reflected in the observation surface direction by the side wall of the protrusions and depressions. Especially, even a light which is radiated in approximately a horizontal direction from the side of the light emitting area is also effectively reflected in the observation surface direction by the tapered side wall of the protrusions and depressions. Accordingly, an amount of effective light to be extracted outside can be increased.

According to an eighth aspect of the present invention, there is provided a light emitting device, in which when the device is seen from an electrode arrangement side, the plurality of protrusions and depressions are disposed between at least the light emitting area and the n-side electrode.

In the above configuration, since a relatively high intensity current flows between the light emitting area and the n-side electrode, a relatively high intensity light is emitted from the light emitting area close to the n-side electrode. In addition, since a plurality of protrusions and depressions are disposed between the light emitting area and the n-side electrode, the relatively high intensity light is deflected in the observation surface direction by the protrusions and depressions before reaching the n-side electrode. Accordingly, an amount of effective light to be extracted outside can be increased.

According to a ninth aspect of the present invention, there is provided a light emitting device, in which when the device is seen from the electrode arrangement side, a semiconductor stack structure which is formed in the light emitting area which is located between the n-side electrode and the p-side electrode has a constricted part which extends from an n-side electrode side on a straight line which connects the n-side electrode and the p-side electrode, wherein the constricted part is provided with the plurality of protrusions and depressions.

In the above configuration, since the constricted part is disposed in the light emitting area instead of the light emitting area in a part of area where an electric current which flows from the n-side electrode to the p-side electrode has a high intensity, and in addition, since a plurality of protrusions and depressions are disposed in the constricted part, a relatively high intensity light which is radiated from the light emitting area along the constricted part is effectively deflected in the observation surface direction. Accordingly, an amount of effective light to be extracted outside can be increased.

According to a tenth aspect of the present invention, there is provided a light emitting device fabrication method in which an n-type semiconductor layer which is composed of nitride semiconductors and has an n-side electrode, and a p-type semiconductor layer which is composed of nitride semiconductors are formed on a substrate. A light emitting layer is disposed between the n-type semiconductor layer and the p-type semiconductor layer. A p-side electrode is disposed on the p-type semiconductor layer through a transparent electrode which is formed in a light emitting area. The n-side electrode and the p-side electrode are arranged on a same side of the substrate. The method includes steps of: a process for forming a n-type semiconductor layer of nitride semiconductors on the substrate; a process for forming a p-type semiconductor layer of nitride semiconductors on the substrate; a process for forming a mask pattern of a first insulation film for disposing a plurality of protrusions and depressions in an area other than the light emitting area; a process for etching using the mask pattern of the first insulation film until the n-type semiconductor layer is exposed; a process for removing the first insulation film on the light emitting area; a process for forming a transparent electrode on the light emitting area; a process for forming a second insulation film on an area except areas where the n-side electrode and the p-side electrode are disposed; and a process for forming the p-side electrode on the transparent electrode.

In the above procedure, an insulation film composed of the first insulation film and the second insulation film is formed on the tops of the protrusions and depressions, as well as the insulation film composed of the second insulation film is formed in the light emitting area and on the bottom and side wall of the protrusions and depressions. As a result, the insulation film on the top of the protrusions and depressions is formed to be thicker than that in the light emitting area and on the bottom and side wall of the protrusions and depressions.

According to an eleventh aspect of the present invention, there is provided a light emitting device fabrication method, in which the method further includes a process for determining a height of an n-type semiconductor layer surface which is exposed by the process for etching and a thickness of the second insulation film which is formed by the process for forming the second insulation film so that an upper surface of the second insulation film at a bottom of the protrusions and depressions is lower than the light emitting layer.

In the above procedure, a desired relation between a height of the insulation film which is formed on the bottom of the protrusions and depressions and a height of the light emitting layer can be easily obtained.

According to a twelfth aspect of the present invention, there is provided a light emitting device fabrication method, in which the method further includes a process for etching off the n-type semiconductor layer by the process for etching so that the upper surface of the second insulation film on the bottom of the protrusions and depressions is lower than the light emitting layer, and a process for etching off the n-type semiconductor layer more than the thickness of the second insulation film.

In the above procedure, a structure can be fabricated, in which the height of the upper surface of the insulation film on the bottom of the protrusions and depressions is lower than the light emitting layer.

According to a thirteenth aspect of the present invention, there is provided a light emitting device fabrication method, in which the method further includes a process for forming a light emitting layer of nitride semiconductors on the substrate.

In the above procedure, an active layer can be formed between the p-type semiconductor layer and the n-type semiconductor layer.

According to the present invention, since a light which is radiated from the side of the light emitting area can be effectively reflected in the observation surface direction by forming the insulation film on the top of the protrusions and depressions to be thicker than that of other areas, extraction efficiency of a light which is emitted in a light emitting device can be increased. In addition, since the insulation film in an area other than the top of the protrusions and depressions is formed to be relatively thin, the light can be effectively extracted outside without an additional absorption of the light when the light is extracted outside through the insulation film in the area.

In addition, according to the present invention, since the second insulation film is further formed without removing the first insulation film which is formed on the top of the protrusions and depressions for disposing the protrusions and depressions, the insulation film on the top of the protrusions and depressions can be easily formed to be thicker than that of other areas by changing only a mask pattern of the photoresist mask in the process for removing the first insulation film. In addition, the insulation film with a desired thickness can be formed in each area by controlling thicknesses of the first and the second insulators.

DETAILED DESCRIPTION OF THE PREFERRED EMBODIMENT

Hereinafter, preferred embodiments according to the present invention will be explained by referring to drawings as needed.

<Configuration of Light Emitting Device>

A light emitting device according to the embodiments is an LED (Light Emitting Diode) which is formed by stacking a nitride semiconductor layer. In addition, protrusions (protrusions 9) are disposed outside a light emitting area as protrusions and depressions.

First Embodiment

Figure 1:
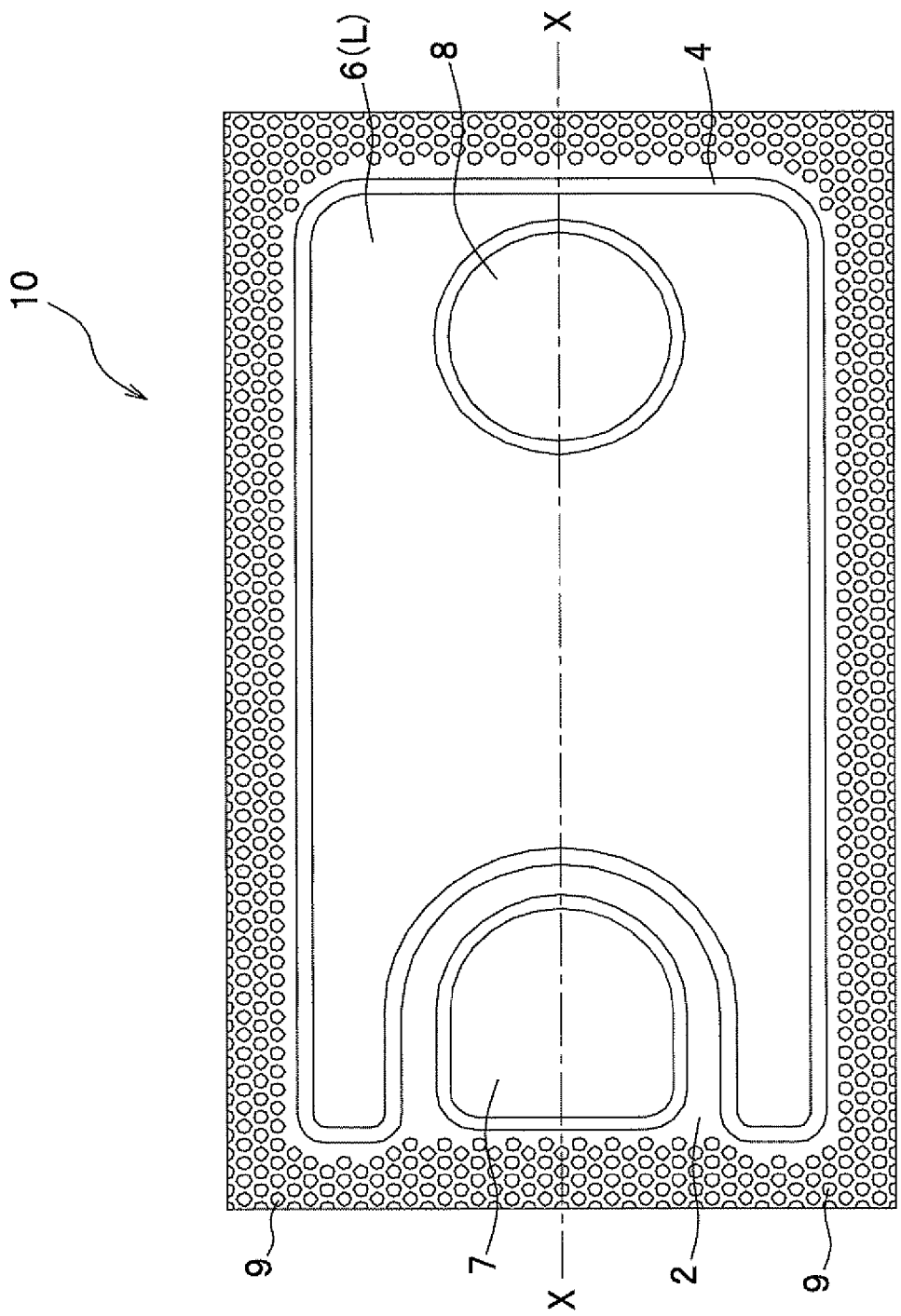
FIG. 1 is a plane view of an LED according to a first embodiment of the present invention, which is seen from an electrode arrangement side.
Figure 2:
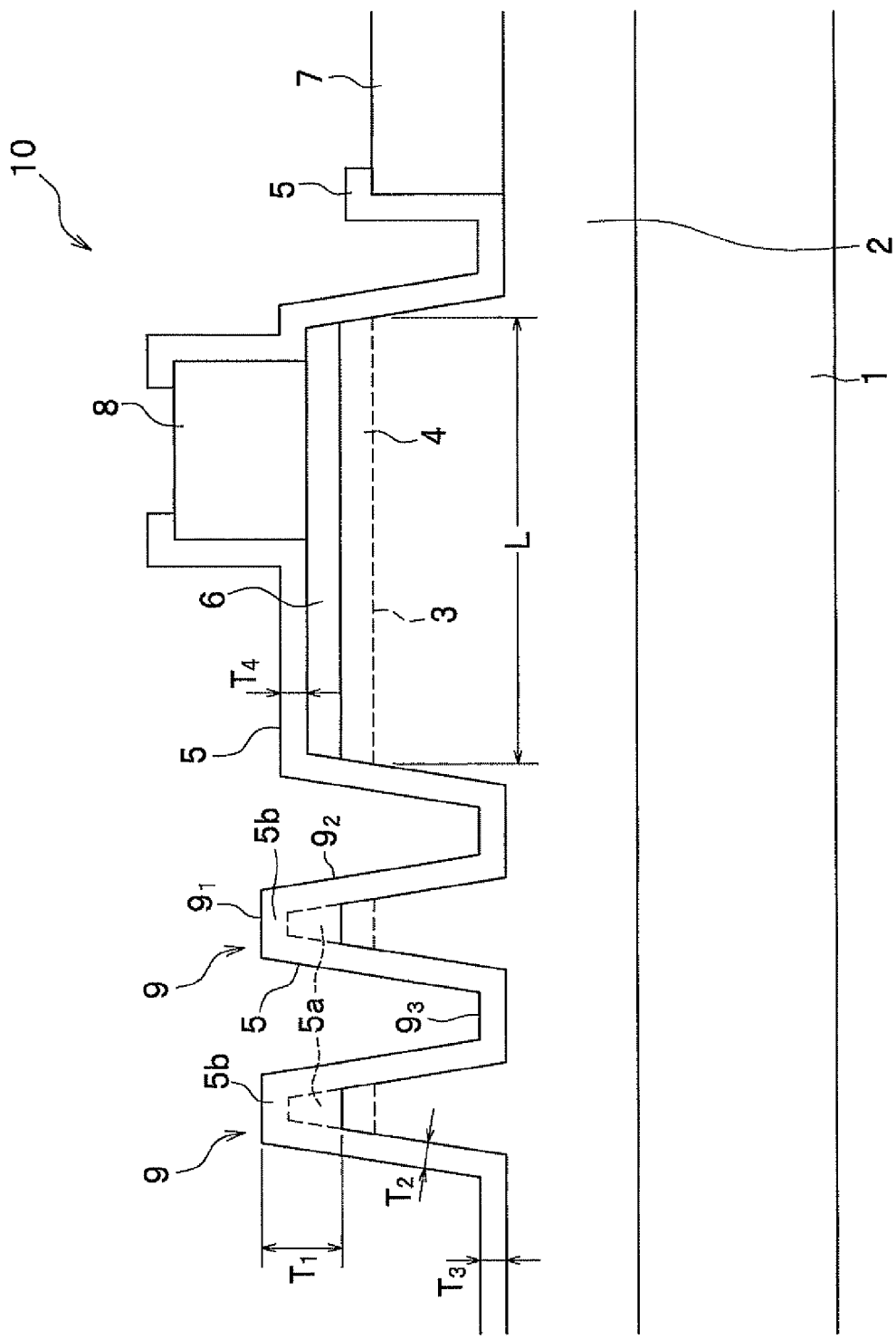
FIG. 2 is a schematic cross sectional view of the LED shown in FIG. 1.

An LED 10 according to a first embodiment will be explained by referring to FIG. 1 and FIG. 2. FIG. 1 is a plane view of an LED according to the first embodiment, which is seen from an electrode arrangement side. FIG. 2 is a schematic cross sectional view which includes an n-side electrode (hereinafter, referred to as n-electrode), a p-side electrode (hereinafter, referred to as p-electrode), and the protrusions, taken along a line X-X of FIG. 1.

In the first embodiment, a semiconductor stack structure which configures an LED structure is formed on a substrate 1 made of sapphire, and the p-electrode 8 and the n-electrode 7 are arranged on a surface of a same side (surface of the substrate 1, on which semiconductor stack structure is formed, that is, upward surface in FIG. 2). A light is extracted from the electrode arrangement side on which an observation surface direction is set. The semiconductor stack structure which configures an LED 10 is formed by sequentially stacking an n-type semiconductor layer 2 which is composed of nitride semiconductors and has the n-electrode 7, a light emitting layer 3 composed of nitride semiconductors, and a p-type semiconductor layer 4 composed of nitride semiconductors, on the substrate 1. In addition, the p-electrode 8 is disposed in the light emitting area L on the p-type semiconductor layer 4 through a transparent electrode 6. Further, an insulation film 5 is formed on an area except areas where the n-electrode 7 and the p-electrode 8 are arranged (area where at least power supply lines are bonded by, for example, wire bonding).

In non-light emitting area other than the light emitting area L, a plurality of protrusions 9 are disposed, and a film thickness $T_1$ of the insulation film 5 which is formed on a top $9_1$ of the protrusions 9 is thicker than a film thickness $T_4$ of the insulation film 5 formed in the light emitting area L. Also, the film thickness $T_1$ of the insulation film 5 formed on the top $9_1$ of the protrusions 9 is thicker than film thicknesses $T_3$ and $T_2$ of the insulation film 5 formed on a bottom $9_3$ and a side wall $9_2$ of the protrusions 9, respectively.

The protrusions 9 have the semiconductor stack structure which includes the n-type semiconductor layer 2, the light emitting layer 3, and the p-type semiconductor layer 4 as in the light emitting area L. However, since the transparent electrode 6 is not formed on the top $9_1$, electric current does not flow in the protrusions 9 when the LED 10 is in operation.

As shown in FIG. 2, the n-type semiconductor layer 2 expands on a whole bottom surface of the LED 10, and the light emitting layer 3 is stacked on the n-type semiconductor layer 2, then, the p-type semiconductor layer 4 is stacked on the light emitting layer 3. An area on the p-type semiconductor layer 4 where the transparent electrode 6 is further formed is the light emitting area L, and the p-electrode 8 is disposed on a part of the transparent electrode 6. In addition, the n-electrode 7 is disposed on a part, where the n-type semiconductor layer 2 is exposed, of the n-type semiconductor layer 2. In an area other than light emitting area L and the n-electrode 7, a plurality of protrusions 9 are formed so as to surround the light emitting area L. Further, the insulation film 5 is formed on an area other than the areas of the n-electrode and the p-electrode, where the power supply lines are bonded.

Next, a configuration of each part of the device will be explained in detail.

(Substrate)

For example, a sapphire substrate or a SiC (silicon carbide) substrate with a thickness of about 300 to 2000 μm can be used for the substrate 1, as a preferable substrate for semiconductor devices which use GaN (gallium nitride) compound semiconductors as the nitride semiconductors. For relaxing differences of physical characteristics such as a lattice constant and a thermal expansion coefficient between a crystal structure of the substrate 1 and a semiconductor crystal which is formed on the substrate 1, the semiconductor stack structure may be formed after forming a buffer layer which uses nitride semiconductors such as GaN and AlGaN between the substrate 1 and the semiconductor stack structure. In addition, if a substrate which is an identical material to the nitride semiconductors, for example, GaN, is used, it is more preferable since the buffer layer can be omitted.

(n-type Semiconductor Layer, Light Emitting Layer, p-type Semiconductor Layer)

The semiconductor stack structure according to the first embodiment is formed using GaN compound semiconductors, which are nitride semiconductors.

The n-type semiconductor layer 2 is formed on the substrate 1 through a buffer layer as needed. The n-type semiconductor layer 2 has a structure where an n-type contact layer (hereinafter, referred to as n-contact layer) composed of Si-doped GaN and an n-type clad layer (hereinafter, referred to as n-clad layer) composed of n-type AlGaN are stacked in this order. The n-type semiconductor layer 2 has a thickness of about 1000 to 10000 nm. An active layer composed of InGaN is stacked on the n-type semiconductor layer 2. The active layer corresponds to a light emitting layer 3 of the LED 10. The light emitting layer 3 has a thickness of about 10 to 1000 nm. In addition, the p-type semiconductor layer 4 is stacked on the light emitting layer 3. The p-type semiconductor layer 4 has a structure where a p-type clad layer (hereinafter, referred to as p-clad layer) composed of p-type AlGaN and a p-type contact layer (hereinafter, referred to as p-contact layer) composed of Mg-doped GaN are stacked in this order. The p-type semiconductor layer 4 has a thickness of about 50 to 5000 nm.

The LED 10 according to the first embodiment has a DH (Double Hetero) structure where the light emitting layer 3 is sandwiched by the n-type semiconductor layer 2 and the p-type semiconductor layer 4.

It is noted that although the LED 10 according to the first embodiment has a structure having an active layer (light emitting layer 3) which is configured with the DH structure, the LED 10 may be formed with a structure where the light emitting layer 3 is formed as an interface (p-n junction interface) between the n-type semiconductor layer 2 and the p-type semiconductor layer 4. In addition, as the emitting layer 3, the active layer may be configured with a multi-quantum-well structure by, for example, alternately stacking a barrier layer composed of undoped GaN and a quantum-well layer composed of undoped InGaN.

Further, each of the n-type semiconductor layer 2 and the p-type semiconductor layer 4 is configured with a clad layer and a contact layer. However, both or one of the n-type semiconductor layer 2 and the p-type semiconductor layer 4 may be configured with one of the clad layer and the contact layer.

The n-type semiconductor layer 2, the light emitting layer 3, and the p-type semiconductor layer 4 may have any structure if the structure functions as a light emitting device.

(n-side Electrode, p-side Electrode, Transparent Electrode)

The n-side electrode (hereinafter, referred to as n-electrode) 7 is formed on an exposed surface of the n-type semiconductor layer 2 where a part of the p-type semiconductor layer 4, a part of the light emitting layer 3, and a part of the n-type semiconductor layer 2 are removed by, for example, etching. As described above, if the n-type semiconductor layer 2 has a two-layer structure of the n-clad layer and the n-contact layer, the n-electrode 7 is formed on an exposed surface of the n-contact layer. The n-electrode 7 is formed by sequentially forming W, Pt, and Au on the n-type semiconductor layer 2 to have a thickness of about 200 to 7000 nm.

The p-side electrode (hereinafter, referred to as p-electrode) 8 is formed on the p-type semiconductor layer 4 through the transparent electrode 6. The transparent electrode 6 is formed on approximately a whole p-type semiconductor layer 4, which is the light emitting area L. The transparent electrode 6 is disposed for uniformly diffusing an electric current which is supplied from the p-electrode 8 over the light emitting area L of the p-type semiconductor layer 4. The transparent electrode 6 is transparent, while it is electrically conductive for diffusing the electric current so that a light emitted from the light emitting layer 3 is mainly extracted from an upper side of the semiconductor stack structure. For example, a conductive oxide film, a thin metal film which is formed by sequentially forming Ni and Au on the p-type semiconductor layer 4, and a thin Ni-Au alloy film may be used as the electrode material. As the conductive oxide film, an oxide film which contains at least one element selected from a group of Zn, In, Sn, Ga, and Mg may be used. Specifically, for example, the oxide film is ITO (Sn-doped $In_2O_3$), $In_2O_3$, IFO (F-doped $In_2O_3$), $SnO_2$, ATO (Sb-doped $SnO_2$), FTO (F-doped $SnO_2$), CTO (Cd-doped $SnO_2$), AZO (Al-doped ZnO), IZO (In-doped ZnO), or GZO (Ga-doped ZnO). Especially, ITO is excellent in transparency and electric current diffusivity, thereby ITO is preferable for improving the light emitting efficiency. The transparent electrode 6 has a thickness of about 5 to 1000 nm.

The p-electrode 8 can be formed with a similar manner to the n-electrode 7, by sequentially forming W, Pt, and Au on the transparent electrode 6. If the n-electrode 7 and the p-electrode 8 are formed of same materials, a formation process of each of the electrodes can be unified. The p-electrode 8 has a thickness of about 200 to 7000 nm.

It is noted that as long as a material which configures each of the n-electrode 7, p-electrode 8, and transparent electrode 6 can form an ohmic contact with the n-type semiconductor layer 2, transparent electrode 6, and p-type semiconductor layer 4, respectively, the material other than the above-described materials may also be used.

(Insulation Film)

The insulation film 5 is formed on a whole area of the device as a passivation film except regions where power supply lines of the n-electrode 7 and the p-electrode 8 are bonded. For example, $SiO_2$, SiN, SiON, $ZrO_2$, $TiO_2$, NbO, $HfO_2$, and $Nb_2O_5$ can be used for forming the insulation film 5. Especially, since $SiO_2$ and $TiO_2$ have a stable refractive index and a stable transmission rate, a stable light extraction characteristic easily can be obtained. In addition, the film can be formed at a less expensive cost.

The protrusion 9 of the insulation film 5 is formed by stacking two layers, a first insulation film 5a and a second insulation film 5b which covers the first insulation film 5a, on the p-type semiconductor layer 4 composed of nitride semiconductors. The first insulation film 5a and the second insulation film 5b are configured with at least one of the aforementioned materials such as $SiO_2$, SiN, SiON, $ZrO_2$, $TiO_2$, NbO, $HfO_2$, and $Nb_2O_5$. In addition, the first insulation film 5a and the second insulation film 5b may be configured with the same materials, and may also be configured with different materials. For example, the first insulation film 5a may be configured with $SiO_2$, and the second insulation film 5b may be configured with one of the materials selected from $SiO_2$, SiN, SiON, $ZrO_2$, $TiO_2$, NbO, $HfO_2$, and $Nb_2O_5$. In this case, for example, $SiO_2$ which configures the first insulation film 5a and the second insulation film 5b may be patterned by wet etching, and wet etching or dry etching, respectively.

When the first insulation film 5a and the second insulation film 5b are configured with heterogeneous materials, the materials which configure the first insulation film 5a and the second insulation film 5b can be selected so that a difference in refractive index between the p-type semiconductor layer 4 and the first insulator layer 5a becomes smaller than that of between the first insulation film 5a and the second insulation film 5b. For example, when the p-type semiconductor layer 4 composed of nitride semiconductors is GaN which has a refractive index of about 2.5, it is preferable to select $Nb_2O_5$ which has a refractive index of about 2.2 as the first insulation film 5a, and to select $SiO_2$ as the second insulation film 5b which has a refractive index of about 1.4. A light which propagates underneath the protrusions 9 can be efficiently extracted outside even in the protrusions 9 which are covered with a relatively thick insulation film by setting relations in the refractive indexes among the p-type semiconductor layer 4, the first insulation film 5a, and the second insulation film 5b as described above.

In the embodiment, both the first insulation film 5a and the second insulation film 5b which constitutes the insulation film 5 of the protrusions 9 are configured with a single insulation film. However, one or both of the first insulation film 5a and the second insulation film 5b may be configured with a plurality of layers configured with heterogeneous materials. In this case, a material of each of the layers can be selected so that a difference in refractive index between the layers of the insulation film 5 has the identical relation as described above.

As described above, the film thickness $T_1$ on the top $9_1$ of the protrusions 9 of the insulation film 5 is formed thicker than that of other areas, such as the film thickness $T_2$ on the side wall $9_2$ and the film thickness $T_3$ on the bottom $9_3$ of the protrusions 9, and the film thickness $T_4$ on the transparent electrode 6. In addition, a height from the substrate 1, on which the semiconductor stack structure is formed, to an upper surface of the insulation film 5, which is formed on the top $9_1$ of the protrusions 9, is higher than a height of the light emitting layer 3 from the substrate 1. Therefore, the insulation film 5 on the surface of the protrusions 9 reflects a light which is emitted from the side of the light emitting area L in an upward direction, which is the observation direction.

The insulation film 5 has a thickness of about 50 to 2500 nm at the top of the protrusions 9, and a thickness about 20 to 1000 nm in an area other than the protrusions 9.

(Protrusions/Protrusions and Depressions)

Figure 9:
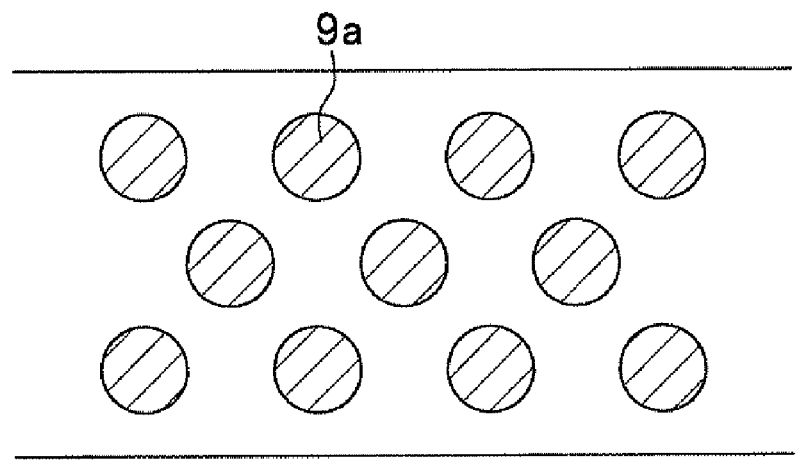
FIG. 9A is a plane view of an LED for explaining protrusions and depressions according to the embodiments, which is seen from an electrode arrangement side.
FIG. 9B is a plane view of an LED for explaining protrusions and depressions according to the embodiments, which is seen from an electrode arrangement side.
Figure 9:
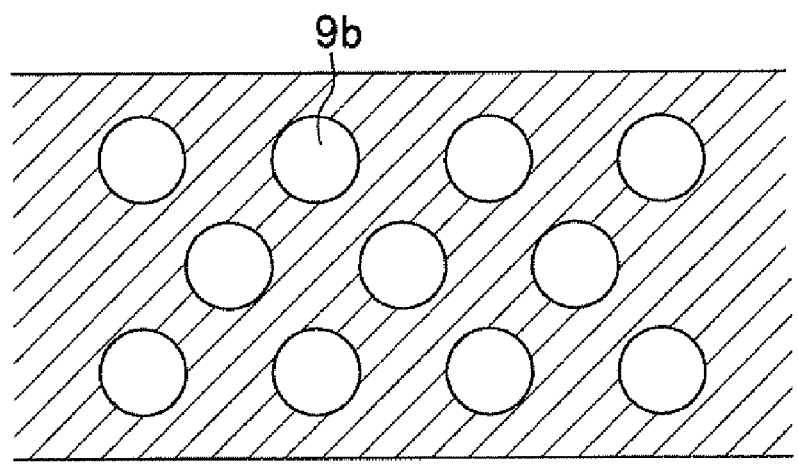

The LED 10 according to the first embodiment is formed so that a plurality of protrusions 9 surround the light emitting area L. Here, protrusions and depressions may be a convex shape (protrusion 9a) as shown FIG. 9A, and also may be a concave shape (depression 9b) as shown in FIG. 9B. It is noted that FIG. 9A and FIG. 9B are plane views of an area where the protrusions and depressions are formed, which are seen from an electrode arrangement side. A hatched portion shows a top.

Both the protrusions and depressions shown in FIG. 9A and FIG. 9B can increase an amount of effective light which is extracted outside. Especially, the convex shape shown in FIG. 9A is more preferable because almost all of the light which is emitted from the side of the light emitting area can be fully reflected in the observation surface direction.

The LED 10 according to the first embodiment shown in FIG. 1 can control light extraction efficiency and light orientation by surrounding the light emitting area, which emits light in operation, with the protrusions 9, and utilizing a surface area on the electrode arrangement side of the LED 10.

Generally, an LED is fabricated as follows. After forming various kinds of semiconductor layers on such a substrate made from sapphire, a predetermined area of the substrate is thinned by, for example, etching. Then, the substrate is diced into a discrete LED in the thinned area. In the embodiment, a specific area may be prepared for forming the protrusions 9. However, by forming a plurality of protrusions 9, for example, in a thinned area in which the substrate is diced or around the n-electrode 7, an increase of the fabrication process can be prevented. That is, it is preferable to normally form the protrusions 9 according to the embodiment in a desired area on a surface of the n-type semiconductor 2 which is to be formed on the electrode arrangement side.

As shown in FIG. 2, a height of the top $9_1$ of the protrusions 9 from the substrate 1, on which the semiconductor stack structure is formed, is made higher than that of the light emitting layer 3 when the LED 10 is seen from the side in the cross sectional view. In addition, the bottom $9_3$ of the protrusions 9 is formed to be lower than the light emitting layer 3. Since the LED 10 according to the first embodiment has the DH (Double Hetero) structure, the top $9_1$ of the protrusions 9 is required to be higher than, at least, an interface between the light emitting layer 3 and the n-type semiconductor layer 2 which is adjacent to the light emitting layer 3, and more preferably to be higher than an interface between the light emitting layer 3 and the p-type semiconductor layer 4 which is adjacent to the light emitting layer 3. By configuring a structure of the LED 10 as described above, a light which is emitted from the side of the light emitting area L, which has an identical height to the light emitting layer 3, is effectively reflected in the observation surface direction by the side wall $9_2$ of the protrusions 9.

In addition, the bottom $9_3$ of the protrusions 9 is required to be lower than, at least, the interface between the light emitting layer 3 and the p-type semiconductor layer 4 which is adjacent to the light emitting layer 3, and more preferably to be lower than the interface between the light emitting layer 3 and the n-type semiconductor layer 2 which is adjacent to the light emitting layer 3. In addition, identical protrusions 9 can be formed by using a structure in which not only using the DH structure but also using, for example, a quantum-well-structure, which is sandwiched between the n-type semiconductor layer 2 and the p-type semiconductor layer 4, for the light emitting layer 3. That is, the top $9_1$ of the protrusions 9 is required to be higher than the interface between the light emitting layer 3 and the n-type semiconductor layer 2, and more preferably to be higher than the interface between the light emitting layer 3 and the p-type semiconductor layer 4. In addition, the bottom $9_3$ of the protrusions 9 is required to be lower than the interface between the light emitting layer 3 and the p-type semiconductor layer 4, and more preferably to be lower than the interface between the light emitting layer 3 and the n-type semiconductor layer 2. By configuring the structure of the LED 10 as described above, the light which is emitted from the side of the light emitting area L, which has the identical height to the light emitting layer 3, is effectively reflected in the observation surface direction by the side wall $9_2$ of the protrusions 9.

In the first embodiment, the insulation film 5 on the top $9_1$ of the protrusions 9 is formed to be thicker than that of other areas. Here, a configuration of the top $9_1$ of the protrusions 9 of the LED 10 according to the embodiment will be explained by referring to FIG. 3.

Figure 3:
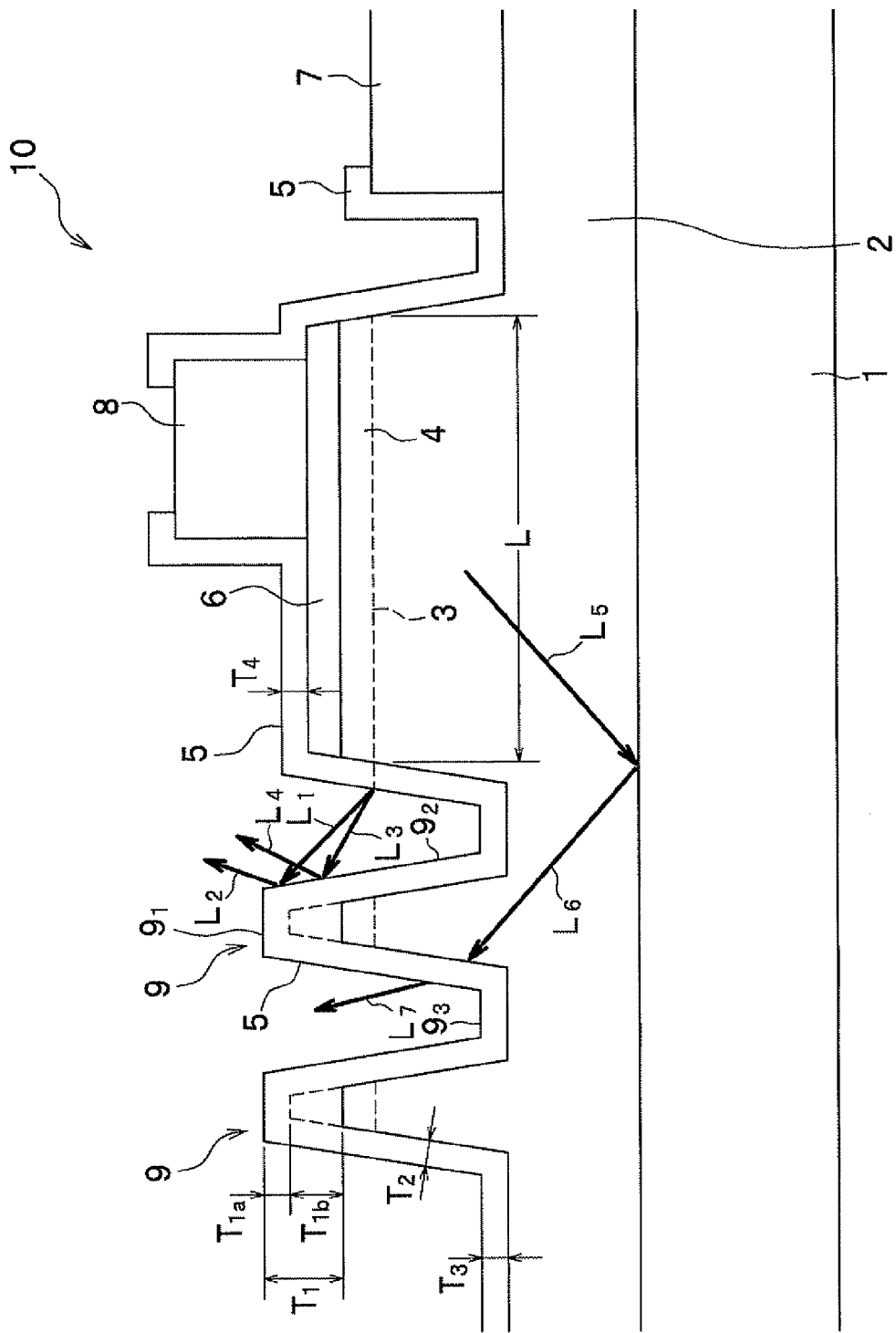
FIG. 3 is an illustration for explaining extraction of a light outside, which is emitted in the LED shown in FIG. 2.

FIG. 3 is a schematic illustration for explaining that, in the LED according to the embodiment in FIG. 2, a light which is emitted from a light emitting layer and radiated from the side of the light emitting area of the LED, and a light which propagates in a direction opposite (bottom direction in FIG. 3) to the observation surface direction are deflected in the observation surface direction.

In the LED 10, the insulation film 5 is formed on an outermost surface of the LED 10 except areas of the n-electrode 7 and the p-electrode 8. The film thickness $T_1$ on the top $9_1$ of the protrusions 9 of the insulation film 5 is made thicker than the film thickness $T_2$ on the side wall $9_2$ and the film thickness $T_3$ on the bottom $9_3$ of the protrusions 9, and also to be thicker than the film thickness $T_4$ on the transparent electrode 6. The insulation film 5 on the top $9_1$ of the protrusions 9 is composed of a film thickness $T_{1b}$, which corresponds to the film thicknesses $T_2$ to $T_4$ of the insulation film 5 on the areas other than the top $9_1$ of the protrusions 9, and a film thickness $T_{1a}$, which is an additional thickness to the $T_{1b}$.

In addition, in the embodiment, a plurality of protrusions 9 are formed, and the protrusions 9 are configured to include the p-type semiconductor layer 4. Each top $9_1$ of the protrusions 9 has approximately an identical height. Further, the top $9_1$ of the protrusions 9 has a thicker insulation film 5 than that of other areas. In addition, the height of the top $9_1$ of the protrusions 9 is made higher than that of the p-type semiconductor layer 4, preferably higher than that of the transparent electrode 6, and more preferably higher than that of the insulation film 5 which is formed on the transparent electrode 6.

In addition, preferably, a cross section of the protrusions 9 is tapered to become narrower in a semiconductor stack direction, that is, a shape of the protrusions 9 is tapered to become narrower toward the p-type semiconductor layer 4 from the n-type semiconductor layer 2. It is preferable that a taper angle of the protrusion 9 is in a range between 30° and 80° (degree), and more preferably in a range between 40° and 70° (degree).

In addition, a cross section of the protrusions 9 may be various kinds of shapes, such as a triangle and a half circle, and preferably a trapezoid. That is, a circular truncated cone is preferable as a shape of the protrusions 9.

In addition, when the cross section of the protrusions 9 is a trapezoid, a concave portion may further be disposed on an upper surface (p-type semiconductor layer 4 side) of the trapezoid.

In addition, in the LED 10 according to the embodiment, it is preferable that, more than one, preferably more than two of the protrusions 9 are arranged, at least partially duplicated, in a direction approximately perpendicular to a radiation end face of the semiconductor stack structure which is formed on the light emitting area L.

It is preferable that the protrusions 9 according to the first embodiment be concurrently formed when a part of the n-type semiconductor layer 2 is exposed for forming an area where the n-electrode 7 is to be arranged. That is, since the LED 10 according to the first embodiment has a structure where the p-electrode 8 and n-electrode 7 are arranged on a same side surface, it is necessary to remove at least an area of the p-type semiconductor layer 4 to expose the n-type semiconductor layer 2 where the n-electrode 7 is arranged, after forming layers of from the n-type semiconductor layer 2 to the p-type semiconductor layer 4 on the substrate 1. For details, for example, a mask pattern is formed on areas where the transparent electrode 6 and the protrusions 9 are to be formed after forming the p-type semiconductor layer 4, and the layers of an area other than the masked areas are removed by, for example, etching until the n-type semiconductor layer 2 is exposed. Accordingly, the exposed area where the n-electrode 7 is to be arranged and the protrusions 9 can be concurrently formed, thereby resulting in simplification of the fabrication process.

The protrusions 9 which are configured with nitride semiconductors as described above have an identical structure to that of the semiconductor stack structure in the light emitting area L, in other words, the protrusions 9 are configured with a plurality of layers which have different materials.

In addition, such a number of pieces and a density of the protrusions 9 according to the first embodiment are not limited. However, according to experiments of the inventors, the number of pieces may be not less than 100, preferably not less than 200, more preferably not less than 300, and further more preferably not less than 500 in the non-light emitting area. It is noted that a ratio of an area occupied by the protrusions 9 to a non-light emitting area (for details, ratio of area occupied by the protrusions 9 and interface of non-light emitting area to non-light emitting area), which are seen from the electrode arrangement side, is not less than 20%, preferably not less than 30%, and more preferably not less than 40%. It is noted that the ratio of not more than 80% is preferable even through there is no upper limit. In addition, an area of one protrusion 9 with the interface of the non-light emitting area is 3 to 300 μm$^2$, preferably 6 to 80 μm$^2$, and more preferably 12 to 50 μm$^2$.

<Operation of Light Emitting Device>

Next, an operation of the LED 10 according to the embodiment of the present invention will be explained by referring to FIG. 1 and FIG. 2.

The LED 10 emits a light in the light emitting layer 3 which is formed in the light emitting area L by connecting the p-electrode 8 to a positive terminal and the n-electrode 7 to a negative terminal, thereby forwardly biasing voltage to the semiconductor stack structure which configures the LED 10.

The light which is emitted in the light emitting layer 3 is radiated in a random direction from the light emitting layer 3. A light which is radiated from the light emitting layer 3 in an upward direction, which is the observation surface direction, is extracted outside through the transparent electrode 6. A light which is emitted from the light emitting layer 3 in a lateral direction and radiated from the side of the semiconductor stack structure is reflected in the observation surface direction by the side wall $9_2$ of the protrusions 9, thereby the light is extracted outside. In addition, a light which is emitted from the light emitting layer 3 in a downward direction, which is a direction to the substrate 1, repeats total reflections at interfaces of the semiconductor stack structure and reaches the protrusions 9. Then, the light is extracted outside the LED 10 by passing through the side wall $9_2$ and being diffused by the protrusions 9.

It is noted that operations according to a second embodiment to a fifth embodiment, which will be described later, are identical to the operation described above.

Next, deflections of a light, which is emitted in the light emitting layer 3 and radiated from the side of the light emitting area L of the LED 10, and a light, which is emitted in the light emitting layer 3 and propagates in a direction opposite to the observation surface direction (downward direction in FIG. 3), to the observation surface direction will be explained by referring to FIG. 3. In the first embodiment, the insulation film 5 on the top $9_1$ of the protrusions 9 is formed to be thicker than that of areas other than the top $9_1$ of the protrusions 9.

First, deflections of a light $L_1$ and a light $L_3$ will be explained, which are radiated from the side which has an identical height to the light emitting layer 3 of the light emitting area L. The lights $L_1$ and $L_3$ are radiated obliquely upward from the side of the light emitting area L. The lights $L_1$ and $L_3$ are reflected by the insulation film 5 which is formed on the top $9_1$ of the protrusions 9, and deflected in approximately an upward direction, which is the observation surface direction, as a light $L_2$ and a light $L_4$, respectively.

Here, if a film thickness of the insulation film 5 on the top $9_1$ of the protrusions 9 is assumed to be $T_{1b}$ which corresponds to a film thickness of the insulation film 5 in the area other than the top $9_1$ of the protrusions 9, a light of which radiation angle with respect to a surface of the substrate 1 is smaller than that of the light $L_3$ is reflected in the observation surface direction by the protrusions 9. However, a light of which radiation angle with respect to the surface of the substrate 1 is larger than that of the light $L_3$, for example, the light $L_1$, is not reflected by the protrusions 9. As a result, since the light $L_1$ propagates in the oblique direction with keeping an original direction, the light $L_1$ can not be observed from the observation surface direction. Accordingly, the light $L_1$ does not contribute to the light extraction efficiency.

In the LED 10 according to the first embodiment, since the insulation film 5 on the top $9_1$ of the protrusions 9 is formed to be thicker, a height of the protrusions 9 from the substrate 1 becomes higher, thereby the light which is radiated from the side of the light emitting area L is effectively reflected. Accordingly, the light can be deflected in the observation surface direction.

Next, a light $L_5$ which is radiated from the light emitting layer 3 in a direction opposite to the observation surface direction will be explained.

GaN compound semiconductors which are used in the first embodiment have high refractive indexes of about 2.5. On the other hand, a refractive index of sapphire which is used for the substrate 1 is 1.8. Then, a light which propagates to the substrate 1 from the n-type semiconductor layer 2 is totally reflected at an interface between the n-type semiconductor layer 2 and the substrate 1 if an incident angle of the light to the substrate 1 exceeds a critical angle $\sin^{-1}(1.8/2.5)=46°$ (degree) according to Snell's law. In addition, since a refractive index of $SiO_2$ which configures the insulation film 5 formed on a surface of the LED 10 is 1.5, an incident light to $SiO_2$ is totally reflected at an interface between the p-type semiconductor layer 4 and the insulation film 5 with a smaller critical angle, compared with the reflection between the n-type semiconductor layer 2 and the substrate 1 of sapphire.

As described above, a light which is radiated from the light emitting layer 3 with an angle more than the critical angle propagates within the semiconductor layers, and the light is hard to be extracted outside. Therefore, as the light $L_5$ shown in FIG. 3, a light which propagates in a direction opposite to the observation surface direction propagates within the semiconductor layers (n-type semiconductor layer 2, light emitting layer 3, p-type semiconductor layer 4) and the substrate 1, and finally the light is absorbed in the semiconductor layers and the substrate 1 during repeat of the total reflection. Therefore, the light can not be extracted outside, or only an attenuated light is extracted outside, thereby resulting in decrease in light extraction efficiency.

Here, a case where the protrusions 9 are formed will be explained as in the first embodiment. The light $L_5$ is reflected on a surface of the substrate 1 and propagates as a light $L_6$. Then, the light $L_6$ passes through the side wall $9_2$ of the protrusions 9 and is deflected in the observation surface direction as a light $L_7$. At this time, since the insulation film 5 which is formed on the side wall $9_2$ and the bottom $9_3$ of the protrusions 9 has a passive role as a light passing film of the light $L_6$, a thinner insulation film 5 is preferable as long as the film 5 satisfies a function as a passivation film, in consideration of absorption of the light $L_6$ by the insulation film 5. In addition, since the insulation film 5 which is formed on the transparent electrode 6 also has the passive role as the light passing film of a light which is extracted in the observation surface direction, a thinner insulation film 5 is preferable as long as the film 5 satisfies the function as the passivation film. Further, by forming the insulation film 5 on the side wall $9_2$ of the protrusions 9 to be relatively thin, a density of the protrusions 9 is prevented from decreasing.

In the first embodiment, since the insulation film 5 on the top $9_1$ of the protrusions 9 is selectively formed to be thicker, a light extraction efficiency in an area other than the top $9_1$ of the protrusions 9 remains unchanged, thereby a light extraction efficiency in the observation surface direction can be increased by an additional height of the top $9_1$ of the protrusions 9.

In addition, a uniform light extraction can be achieved in all areas of the observation surface direction by disposing a plurality of protrusions 9. Further, since a height of each of the tops of the protrusions 9 becomes approximately equal to each other by configuring the protrusions 9 so as to include the p-type semiconductor layer 4, in addition, since the tops $9_1$ of the protrusions 9 have a thicker insulation film 5 rather than the other areas, a light can be effectively extracted from the top $9_1$ of the protrusions 9 in the observation surface direction without being shielded by the light emitting area L where the semiconductor stack structure which has the p-electrode 8 is disposed. In addition, a light can be extracted more effectively by configuring a height of the top $9_1$ of the protrusions 9 higher than that of the p-type semiconductor layer 4, preferably higher than that of the transparent electrode 6, and more preferably higher than that of the insulation film 5 which is formed on the transparent electrode 6.

In addition, the effect described above can be enhanced by gradually narrowing the protrusions 9 toward a semiconductor stack direction, that is, toward the p-type semiconductor layer 4 from the n-type semiconductor layer 2. That is, by tapering the protrusions 9, thereby reflecting a light from the light emitting layer 3 on surfaces of the protrusions 9, or diffusing a light which propagates in the n-type semiconductor layer 2, a light extraction in the observation surface direction can be effectively performed accordingly.

In addition, it is preferable that a cross section of the protrusions 9 is a trapezoid, that is, it is preferable that the protrusions 9 have a shape of a truncated cone. By configuring the protrusions 9 as described above, a control of light orientation becomes easier, and, as a whole, a uniform light extraction can be achieved. When a light is extracted from a side of the p-type semiconductor layer 4 and the observation surface direction is on the side of the p-type semiconductor layer 4, a remarkable light extraction effect can be achieved by including a flat surface instead of a tip of cone on the protrusions 9 in the observation surface direction, that is, by including a truncated cone instead of a cone.

In addition, it is preferable to dispose a concave portion on an upper surface of the trapezoid (p-type semiconductor layer 4 side) of the protrusions 9, because when a light which has propagated in the n-type semiconductor layer 2 comes into the protrusions 9, the light is likely to be extracted in the observation surface direction by the concave portion which is disposed on the top $9_1$ of the protrusions 9.

In addition, since in the LED 10 according to the first embodiment, more than one, preferably, more than two of the protrusions 9 are arranged, at least partially duplicated, in a direction approximately perpendicular to the radiation end face of the semiconductor stack structure which is formed on the light emitting area L, the aforementioned effect can be easily obtained due to passing of the light from the light emitting area L through the protrusions 9 with a high probability.

In addition, the protrusions 9 have an identical stacked structure to the semiconductor stack structure in the light emitting area L, thereby the protrusions 9 are configured with a plurality of layers with different materials. If the materials are different, refractive indices of the materials become different, thereby a light incorporated into the protrusions 9 is likely to be reflected at each interface between the layers. As a result, it is thought that the stacked structure of the protrusions 9 contributes to increase the light extraction efficiency in the observation surface direction.

<Fabrication Method of Light Emitting Device>

Next, a fabrication method of a light emitting device (LED) according to the embodiment will be explained by referring to drawings.

Figure 4A:
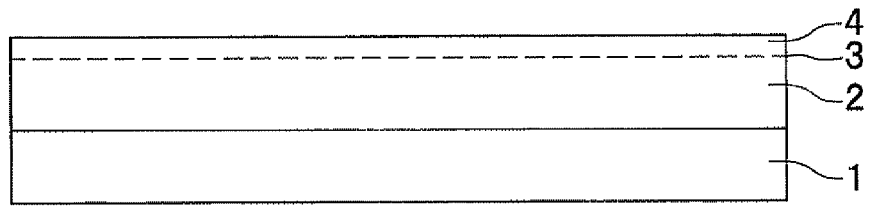
FIG. 4A is an illustration for explaining a fabrication process (formations of n-type semiconductor layer, light emitting layer, and p-type semiconductor layer) of a LED according to the embodiment.

FIG. 4A to FIG. 4N are cross sectional views showing fabrication processes of an LED according to the embodiment shown in FIG. 2. It is noted that, in the embodiment, fabrication processes of a single device, which is fabricated by dividing a wafer into a chip, will be explained. However, in actual fabrication processes, each of the fabrication processes is processed with the wafer on which a plurality of the LED 10 shown in the drawings are arranged in two-dimensionally.

As shown in FIG. 4A, a semiconductor stack structure which is configured with nitride semiconductors is formed, in which firstly, for example, the n-type semiconductor layer 2 composed of Si-doped GaN is formed on the sapphire substrate 1, next, the light emitting layer 3 composed of InGaN is stacked on the the n-type semiconductor layer 2, then, the p-type semiconductor layer 4 composed of Mg-doped GaN is formed and stacked on the light emitting layer 3, by using, for example, a metalorganic chemical vapor deposition (hereinafter, referred to as MOCVD).

(Formation of n-type Semiconductor Layer)

The n-type semiconductor layer 2 is formed by growing a Si-doped GaN crystal, where Si is an n-type impurity in the GaN, on the sapphire substrate 1, using, for example, MOCVD.

The n-type semiconductor layer 2 may be formed on a GaN buffer layer formed on the substrate 1 using MOCVD before deposing the n-type semiconductor layer 2. The n-type semiconductor layer 2 with an excellent crystalline quality can be formed by inserting the buffer layer.

In addition, the n-type semiconductor layer 2 may be configured with a two-layer structure of an n-type contact layer (hereinafter, referred to as n-contact layer) and an n-type clad layer (hereinafter, referred to as n-clad layer)

(Formation of Light Emitting Layer)

The light emitting layer 3 is formed by stacking InGaN on the n-type semiconductor layer 2 using MOCVD.

It is noted that, in the present embodiment, the light emitting layer 3 has a DH (Double Hetero) structure by forming an InGaN active layer as the light emitting layer 3. However, the light emitting layer 3 may be formed by directly making a contact between the n-type semiconductor layer 2 and the p-type semiconductor layer 4 to form a p-n junction (interface) as the light emitting layer 3, without disposing an active layer of a different material between the n-type semiconductor layer 2 and the p-type semiconductor layer 4.

In addition, as the light emitting layer 3, an active layer which is configured with a multiquantum well structure may be formed, for example, by alternately stacking an undoped GaN barrier layer and an undoped InGaN well layer.

(Formation of p-type Semiconductor Layer)

The p-type semiconductor layer 4 is formed by growing an Mg-doped GaN crystal, where Mg is a p-type impurity in the GaN, on the light emitting layer 3, using MOCVD.

The p-type semiconductor layer 4 may also be configured with a two-layer structure of a p-type clad layer (hereinafter, referred to as p-clad layer) and a p-type contact layer (hereinafter, referred to as p-contact layer).

In addition, in a case of the LED 10 which has a structure where the light emitting layer 3 is a p-n junction interface between the n-type semiconductor layer 2 and the p-type semiconductor layer 4, the p-type semiconductor layer 4 can be directly formed on the n-type semiconductor layer 2 to form a p-n junction.

(Formation of First Insulator Mask Pattern)

Figure 4B:
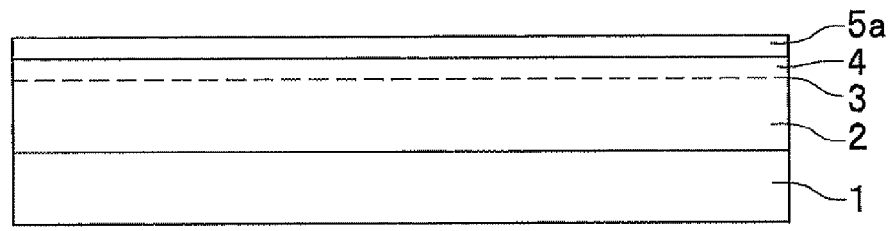
FIG. 4B is an illustration for explaining the fabrication process (formation of first insulation film) of the LED according to the embodiment.

FIG. 4B is an illustration showing a formation of a first insulation film 5a of $SiO_2$ using chemical vapor deposition (hereinafter, referred to as CVD). The first insulation film 5a may be configured with at least one of materials such as $SiO_2$, SiN, SiON, $ZrO_2$, $TiO_2$, NbO, $HfO_2$, and $Nb_2O_5$. The first insulation film 5a becomes a pattern mask for etching for forming the protrusions 9 through photolithography in the following process. When the first insulation film 5a is $SiO_2$, the first insulation film 5a can be relatively easily patterned by wet etching.

Figure 4C:
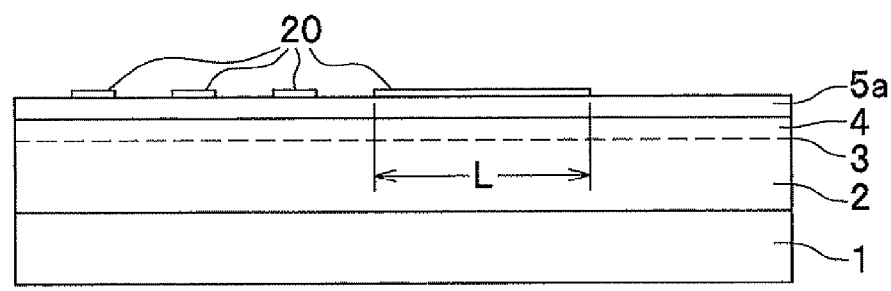
FIG. 4C is an illustration for explaining the fabrication process (formation of photoresist mask) of the LED according to the embodiment.

FIG. 4C is an illustration showing a formation of a photoresist mask 20 on portions corresponding to a top area of the protrusions 9 and a light emitting area L.

Figure 4D:
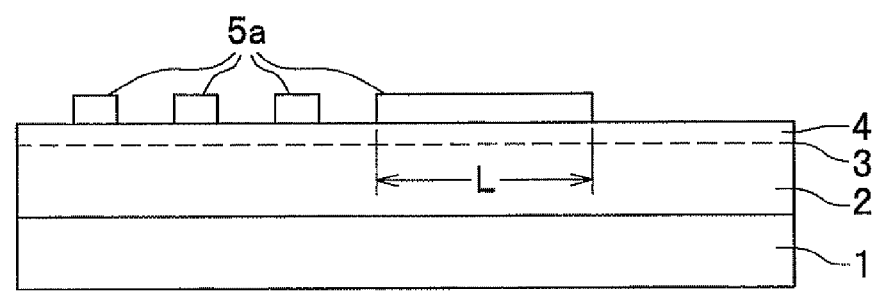
FIG. 4D is an illustration for explaining the fabrication process (formation of mask pattern of the first insulation film) of the LED according to the embodiment.

FIG. 4D is an illustration showing a formation of a pattern mask of the first insulator mask 5a, in which the first insulation film 5a is removed by, for example, reactive ion etching (hereinafter, referred to as RIE) using the photoresist mask 20, then the photoresist mask 20 is removed by, for example, cleaning using an organic solvent. The pattern mask has such a pattern that portions corresponding to tops of protrusions and depressions and the light emitting area L are covered with the first insulation film 5a.

(Etching Process)

Figure 4E:
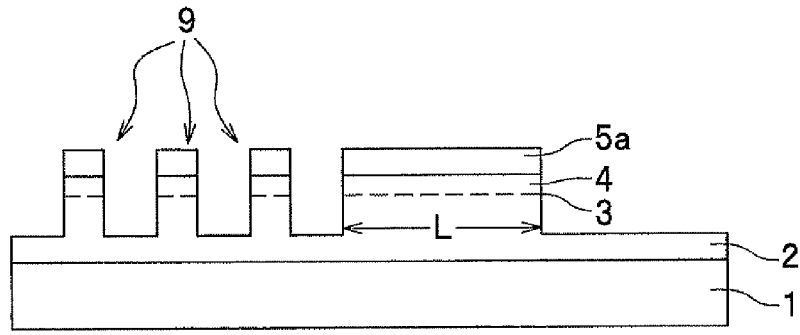
FIG. 4E is an illustration for explaining the fabrication process (etching) of the LED according to the embodiment.

FIG. 4E is an illustration showing a state where the p-type semiconductor layer 4, light emitting layer 3, and a part of the n-type semiconductor layer 2 are etched off by RIE according to the mask pattern of the first insulation film 5a.

Since the etching is continued until the n-type semiconductor layer 2 is exposed, protrusions 9 which have a bottom lower than at least an interface between the light emitting layer 3 and the n-type semiconductor layer 2 are formed. Here, it is required that the light emitting layer 3 is completely exposed by the etching, and it is preferable that an etching depth of the n-type semiconductor layer 2 is deeper than a thickness of a second insulator layer 5b (see FIG. 4L) which is formed in the later process. As described above, when the n-type semiconductor layer 2 has the two-layer structure of the n-clad layer and the n-contact layer, the etching is continued until the n-contact layer is exposed.

Through the etching, the protrusions (protrusions 9) are formed in an area except the light emitting area.

(Removal of First Insulation Film on Light Emitting Area)

Figure 4F:
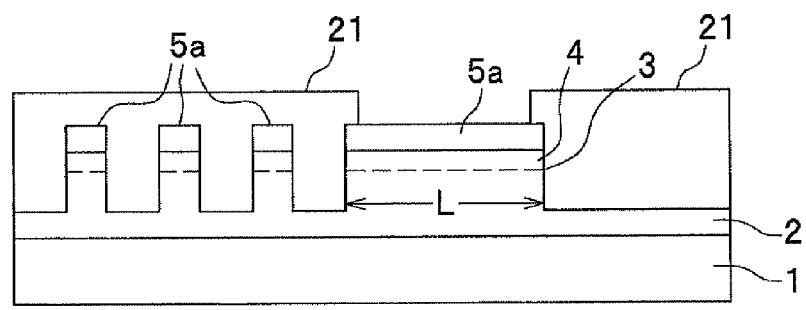
FIG. 4F is an illustration for explaining the fabrication process (formation of photoresist mask) of the LED according to the embodiment.

FIG. 4F is an illustration showing a state where a photoresist mask 21 is formed on a non-light emitting area, that is, except the light emitting area L. The first insulation film 5a which is formed on the light emitting area L is removed by wet etching or dry etching such as RIE.

Figure 4G:
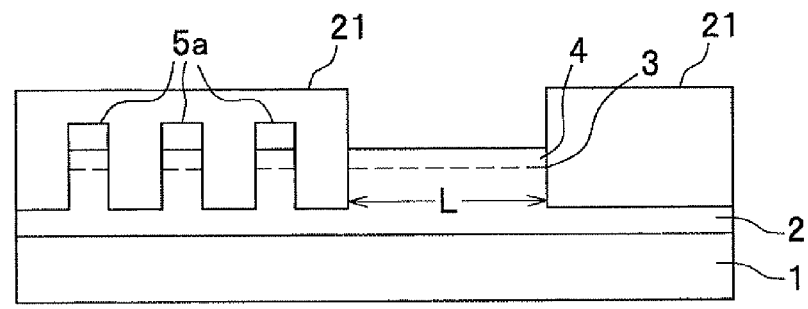
FIG. 4G is an illustration for explaining the fabrication process (removal of the first insulation film on light emitting area) of the LED according to the embodiment.

FIG. 4G is an illustration showing a state where the first insulation film 5a in the light emitting are L is removed, then, the p-type semiconductor layer 4 is exposed. Here, the first insulation film 5a on the top of the protrusions 9 (see FIG. 4E) which are formed in the non-light emitting area is not removed and still remains.

(Formation of Transparent Electrode)

Figure 4H:
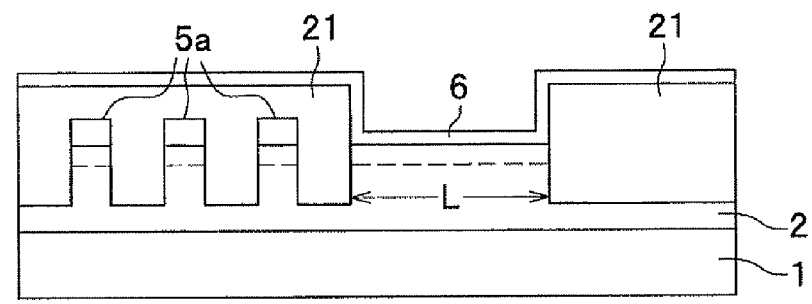
FIG. 4H is an illustration for explaining the fabrication process (formation of transparent electrode) of the LED according to the embodiment.

FIG. 4H is an illustration showing a state where an ITO film is formed on a whole wafer by sputtering, while the photoresist mask 21 remains thereon. The ITO film which is formed on the light emitting area becomes the transparent electrode 6.

Figure 4I:
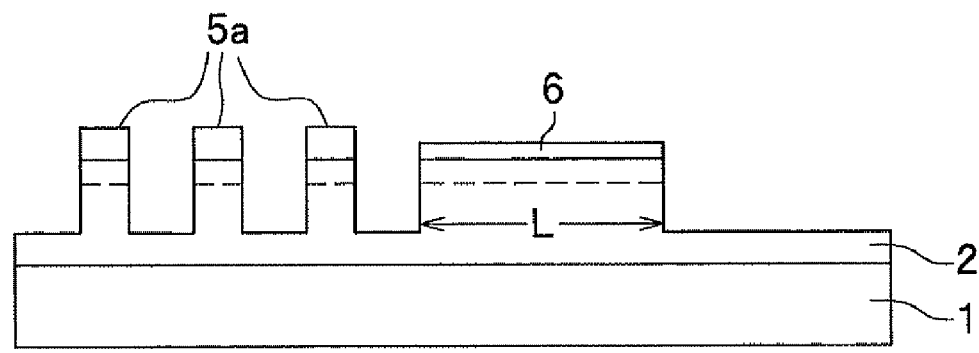
FIG. 4I is an illustration for explaining the fabrication process (removal of photoresist mask) of the LED according to the embodiment.

FIG. 4I is an illustration showing a state where the photoresist mask 21 is lifted-off (removed) using, for example, an organic solvent. Through the liftoff process, the photoresist mask 21 and the ITO which is formed on the photoresist mask 21 are removed, and only the ITO which is formed on the p-type semiconductor layer 4 in the light emitting area L remains as the transparent electrode 6.

(Formation of n-electrode and p-electrode)

Figure 4J:
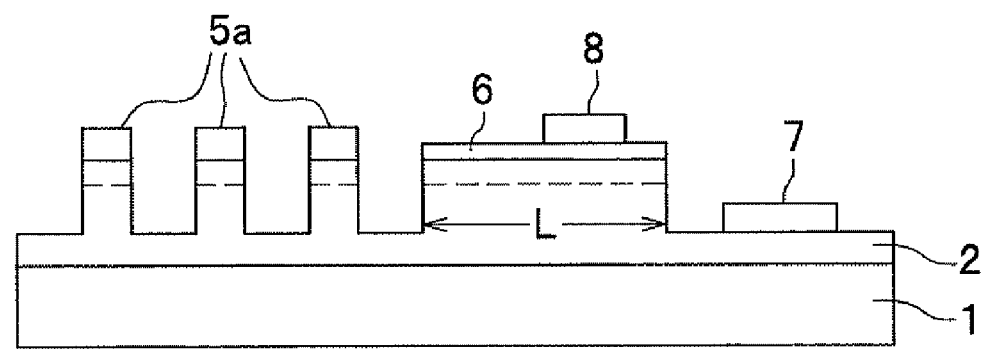
FIG. 4J is an illustration for explaining the fabrication process (formation of n-side electrode and p-side electrode) of the LED according to the embodiment.

FIG. 4J is an illustration showing a state where the n-electrode 7 is formed in a part of the non-light emitting area of the n-type semiconductor layer 2 which is exposed by the etching, and the p-electrode 8 is formed in a part of the transparent electrode 6 which is also exposed. The n-electrode 7 and the p-electrode 8 are formed by evaporation or sputtering, using photolithography.

First, W, Pt, and Au are sequentially formed from a bottom side by evaporation or sputtering. Next, the n-electrode 7 and the p-electrode 8 are formed by patterning a formed metal layer using photolithography. That is, the formed metal layer except portions of the n-electrode 7 and the p-electrode 8 is removed using etching, by masking the portions of the n-electrode 7 and the p-electrode 8 with a photoresist. Accordingly, the n-electrode 7 and the p-electrode 8 are formed as shown in FIG. 4J by removing the photoresist using, for example, an organic solvent.

The n-electrode 7 and the p-electrode 8 may be formed of a stack of Ti/Rh, or other metals and alloys.

It is noted that the n-electrode 7 may be formed by a process different from that of the p-electrode 8 if the process is implemented after the n-type semiconductor layer 2 is exposed by the etching. The n-electrode 7 and the p-electrode 8 may also be formed with different materials, respectively.

(Formation of Second Insulation Film)

Next, a second insulation film 5b is formed on an area except areas where the n-electrode 7 and the p-electrode 8 are arranged.

Figure 4K:
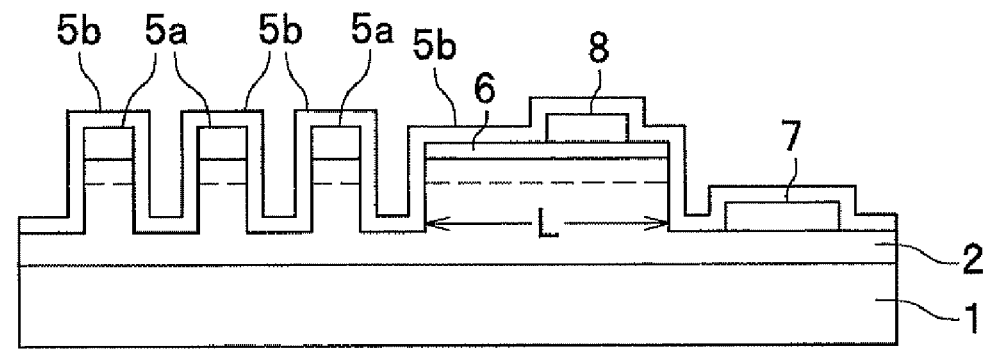
FIG. 4K is an illustration for explaining the fabrication process (formation of second insulation film) of the LED according to the embodiment.

First, the second insulation film 5b of $SiO_2$ is formed on a whole wafer by CVD. The second insulation film 5b may be configured with at least one of materials such as $SiO_2$, SiN, SiON, $ZrO_2$, $TiO_2$, NbO, $HfO_2$, and $Nb_2O_5$. FIG. 4K is an illustration showing a state where the second insulation film 5b is formed on a whole wafer.

Here, the relationship between a height of the exposed surface of the n-type semiconductor layer 2, which is exposed by the aforementioned etching, from the upper surface of the substrate 1 and a thickness of the second insulation film 5b is determined in such a manner that a height of an upper surface of the insulation film 5b on the bottom of the protrusions 9 from an upper surface of the substrate 1 is lower than a height of the light emitting layer 3 from the upper surface of the substrate 1.

That is, the thickness of the second insulator 5b which is formed in the embodiment is controlled to be thinner than a thickness of the n-type semiconductor layer 2 to be removed by the etching. Accordingly, the height of the second insulation film 5 which is formed on the bottom of the protrusions 9 can controlled to be lower than that of the light emitting layer 3, thereby resulting in high fabrication yield of the LED.

Figure 4L:
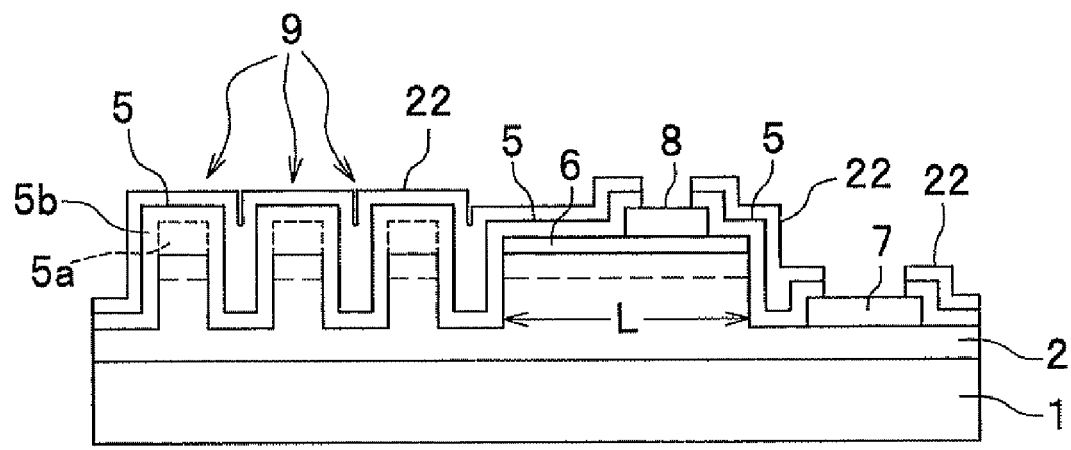
FIG. 4L is an illustration for explaining the fabrication process (pattering of the second insulation film) of the LED according to the embodiment.

FIG. 4L is an illustration showing a state where the second insulation film 5b is patterned by photolithography. A patterning of the second insulation film 5b will be explained. In the process shown in FIG. 4K, the second insulation film 5b which is formed on the whole wafer is covered with a photoresist mask 22 except the portions of the n-electrode 7 and the p-electrode 8 (at least portions where power supply lines of n-electrode 7 and p-electrode 8 are bonded). Then, the second insulation film 5b on the n-electrode 7 and the p-electrode 8 is removed to expose the n-electrode 7 and the p-electrode 8 by etching. This state is shown in FIG. 4L.

Figure 4M:
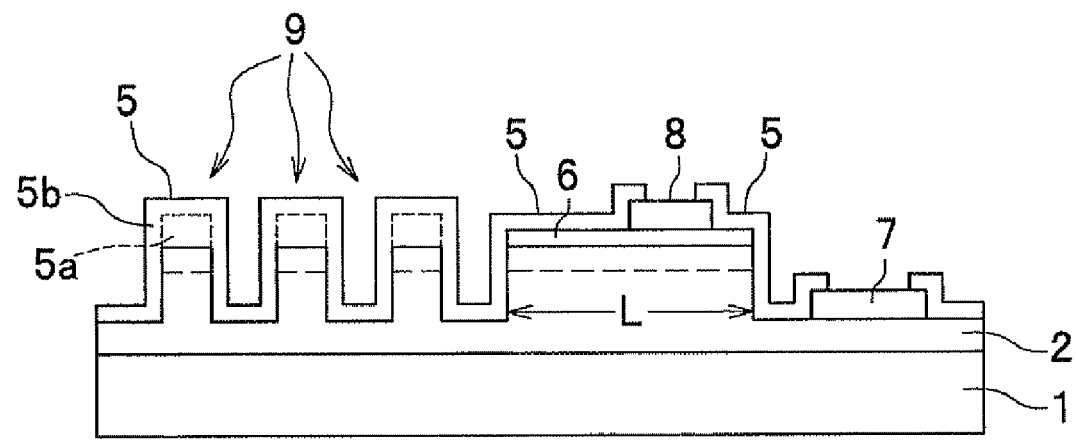
FIG. 4M is an illustration for explaining the fabrication process (removal of photoresist mask) of the LED according to the embodiment.

At the end of the processes, the photoresist mask 22 is removed, for example, by cleaning using an organic solvent. FIG. 4M is an illustration showing a state where the photoresist mask 22 is removed, and a fabrication process of a light emitting device (LED) is completed.

It is noted that, in the embodiment, the second insulation film 5b is formed after forming the n-electrode 7 and the p-electrode 8. However, the second insulation film 5b may be formed before forming the n-electrode 7 and the p-electrode 8. For example, a photoresist mask is formed on the areas where the n-electrode 7 and the p-electrode 8 are arranged by photolithography. Next, the second insulation film 5b is formed on the whole wafer, for example, by evaporation or sputtering. Then, the second insulation film 5b on the areas where the n-electrode 7 and the p-electrode 8 are arranged is removed by the liftoff process. The liftoff process can apply to a case where the second insulation film 5b is configured with any materials such as $SiO_2$, SiN, SiON, $ZrO_2$, $TiO_2$, NbO, $HfO_2$, and $Nb_2O_5$. After that, a photoresist mask is formed on an area except the areas where the n-electrode 7 and the p-electrode 8 are to be arranged by photolithography, and an electrode material is formed on the whole wafer by, for example, evaporation or sputtering. Accordingly, the n-electrode 7 and the p-electrode 8 are formed by removing the electrode material on the area except the areas where the n-electrode 7 and the p-electrode 8 are arranged, and the fabrication process of a light emitting device (LED) is completed.

With the fabrication process described above, on the top of the protrusions 9, the insulation film 5 which is composed of the first insulation film 5a and the second insulation film 5b is formed. Therefore, the insulation film 5 on the top of the protrusions 9 is thicker than that of the insulation film 5 in the light emitting area L and on the bottom and side wall of the protrusions 9, which are composed of only the second insulation film 5b.

That is, according to the fabrication method, the first insulation film 5a formed on the top of the protrusions 9 for forming the protrusions 9 can be left only by patterning the photoresist mask 21 so as to mask the top of the protrusions 9 in the process which removes the first insulation film 5a. In addition, the insulation film 5 on the top of the protrusions 9 can be easily formed to be thicker than that of the other areas by forming the second insulation film 5b. Further, by controlling thicknesses of the first insulation film 5a and the second insulation film 5b, the insulation film 5 can be formed accurately in each area with an intended thickness.

In addition, as shown in the fabrication process, a height of the top of the protrusions 9 except the insulation film 5 from the upper surface of the substrate 1 is identical to that of the p-type semiconductor layer 4 which is left in the light emitting area L. Therefore, a position of the height of the top of the protrusions 9 except the insulation film 5 is higher than that of the light emitting layer 3. In addition, the insulation film 5 which is thicker than that of other area is formed on the top of the protrusions 9.

On the other hand, a height of the bottom of the protrusions 9 except the insulation film 5 from the upper surface of the substrate 1 is a height of the exposed surface of the n-type semiconductor layer 2 by etching, and it is formed to be lower than that of the position of the light emitting layer 3.

Second Embodiment

Figure 5:
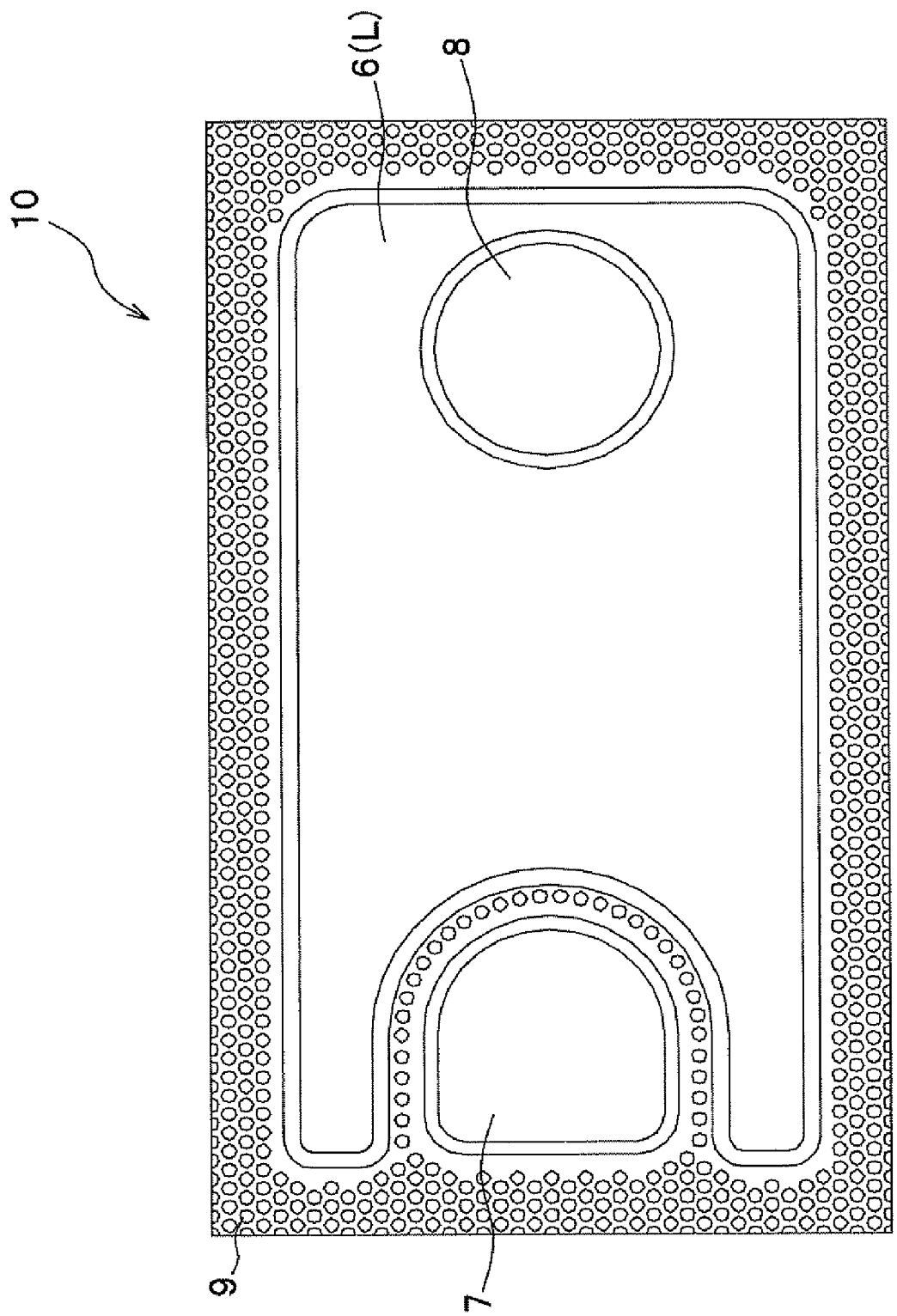
FIG. 5 is a plane view of an LED according to a second embodiment of the present invention, which is seen from an electrode arrangement side.

Next, the LED 10 according to a second embodiment will be explained by referring to FIG. 5. FIG. 5 is a plane view of the LED 10 according to the second embodiment, which is seen from an electrode arrangement side.

The LED 10 according to the second embodiment has an identical configuration to that of the LED 10 according to the first embodiment except disposing the protrusions 9 between the n-electrode 7 and the transparent electrode 6 which is arranged so as to surround the n-electrode 7.

The LED 10 according to the second embodiment is provided with the protrusions 9 in a single line between the n-electrode 7 and the transparent electrode 6 which is arranged so as to surround the n-electrode 7.

In the LED 10 according to the first embodiment shown in FIG. 1, a light which is radiated from the side of the light emitting area L which faces the n-electrode 7 is absorbed or diffused by the n-electrode 7, or propagates in the lateral direction, keeping the original direction. Therefore, a part of the light which is emitted from the light emitting area L does not contribute to the light extraction efficiency. The light which is radiated from the end face of the semiconductor stack structure can be extracted more effectively in the observation surface direction by arranging a plurality of protrusions 9 between the n-electrode 7 and the transparent electrode 6, that is, by disposing a plurality of protrusions 9 in a whole area close to the side of the light emitting area L. In addition, since a light intensity is relatively high around the n-electrode 7, an arrangement of the protrusions 9 between the n-electrode 7 and the transparent electrode 6 is effective for increasing the light extraction efficiency and a controllability of the light orientation. In addition, since the protrusions 9 which are arranged in the area described above deflect the light in the observation surface direction before the light reaches the n-electrode 7, a light intensity loss due to the absorption or diffusion by the n-electrode 7 also can be reduced.

Third Embodiment

Figure 6:
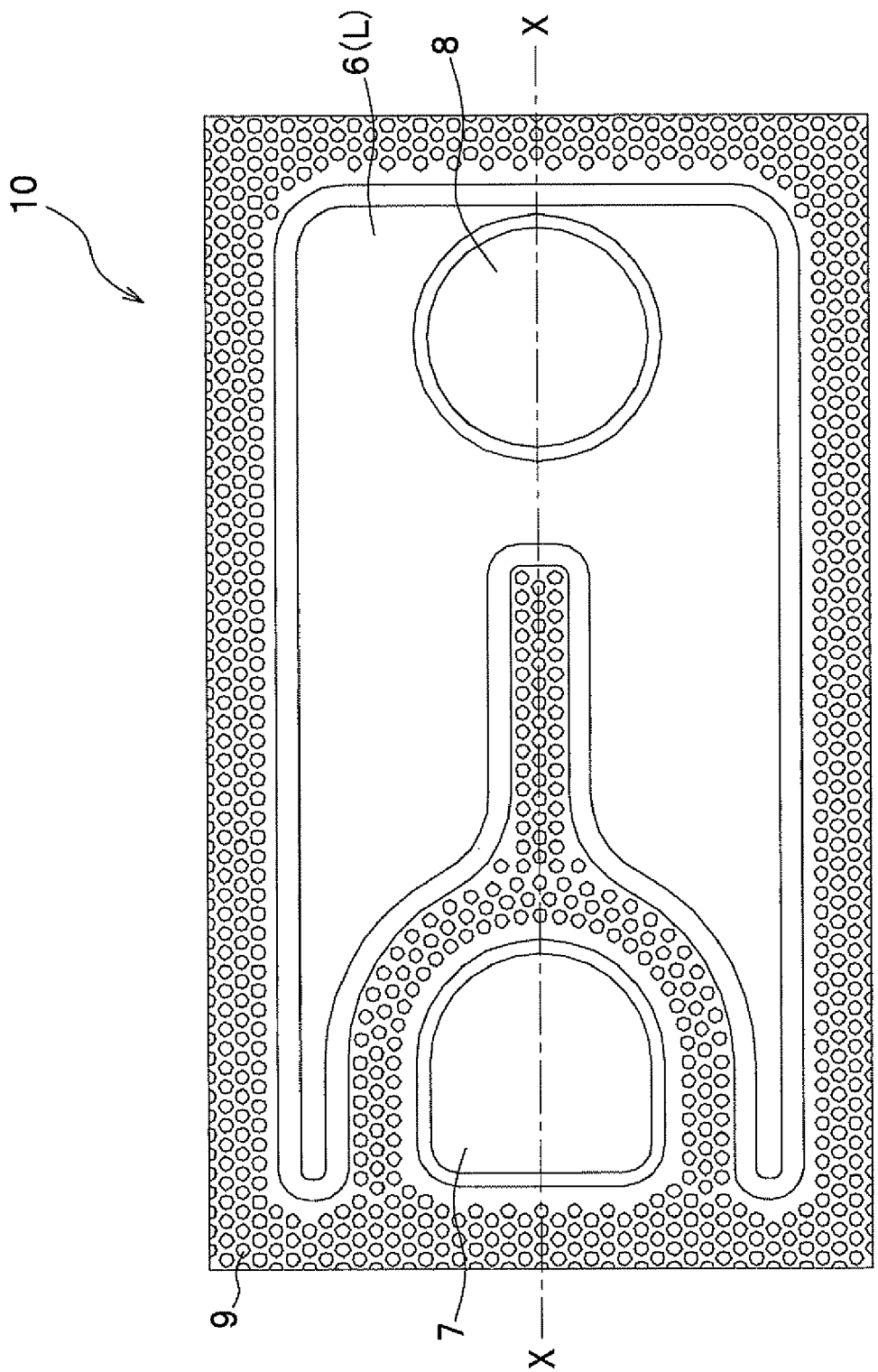
FIG. 6 is a plane view of an LED according to a third embodiment of the present invention, which is seen from an electrode arrangement side.

Next, the LED 10 according to a third embodiment will be explained by referring to FIG. 6. FIG. 6 is a plane view of the LED 10 according to the third embodiment, which is seen from an electrode arrangement side. The LED 10 according to the third embodiment has an identical configuration to that of the LED 10 according to the first embodiment except a shape of a semiconductor stack structure, a shape of the transparent electrode 6 caused by a change of the shape of the semiconductor stack structure, and an area where the protrusions 9 are arranged.

In the LED 10 according to the third embodiment, when the LED 10 is seen from the electrode arrangement side, the semiconductor stack structure which is formed in the light emitting area L located between the n-electrode 7 and the p-electrode 8 has a constricted part which becomes narrower toward the p-electrode 8 from the n-electrode 7 on a straight line X-X which connects the n-electrode 7 and the p-electrode 8, and a plurality of protrusions 9 are formed on the constricted part. An electric current flows along the straight line X-X. By replacing a part of area on the straight line X-X in the light emitting area L with a plurality of protrusions 9, the light extraction efficiency and a controllability of the light orientation can be increased effectively. By removing the part of area on the straight line X-X, it becomes possible to diffuse the electric current in a wide area of the semiconductor stack structure, and a relatively high intensity light which is radiated from the end face of the semiconductor stack structure including the light emitting layer 3 can be extracted in the observation surface direction. With the structure described above, the light extraction efficiency and the controllability of the light orientation can be increased.

Fourth Embodiment

Figure 7:
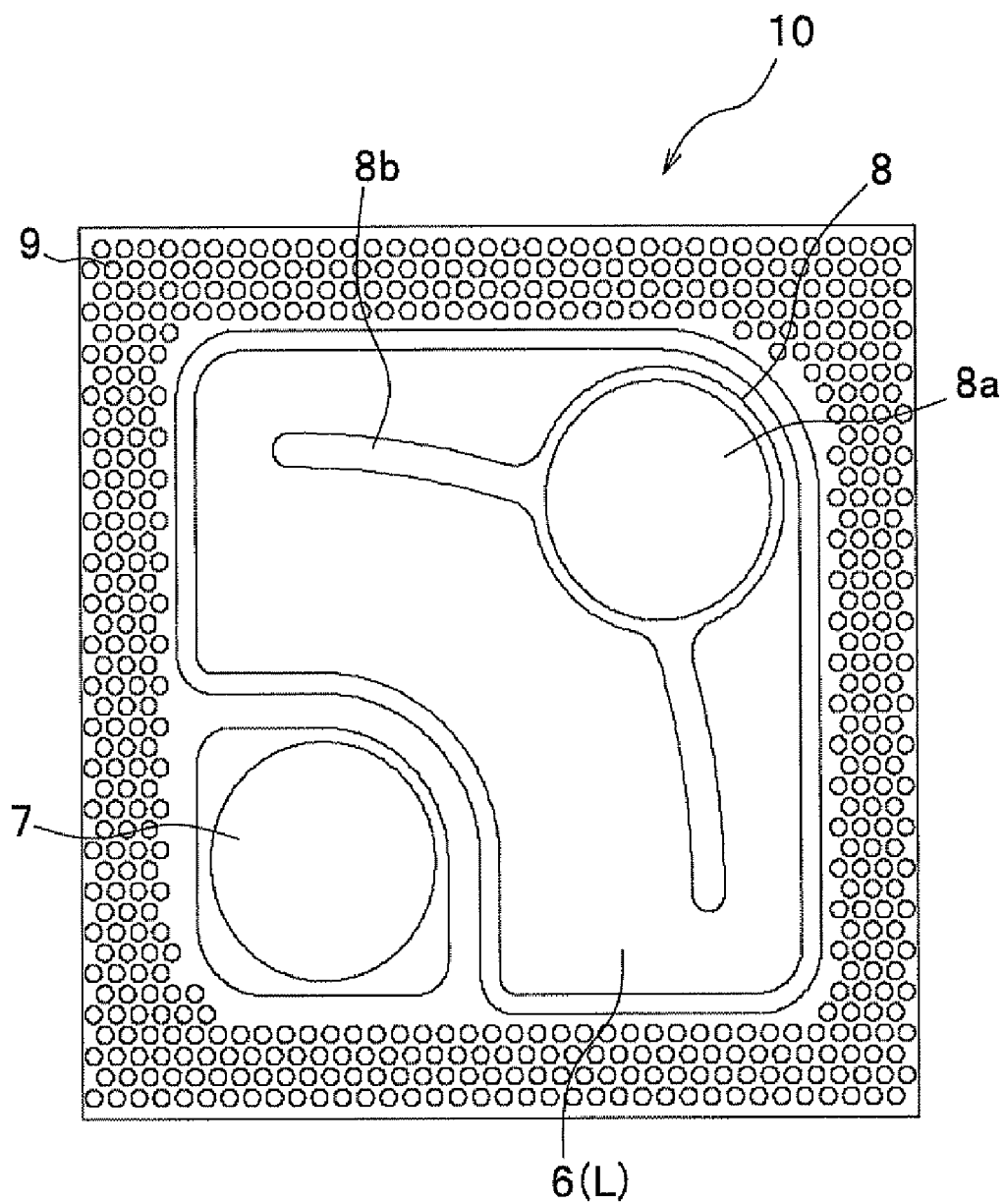
FIG. 7 is a plane view of an LED according to a fourth embodiment of the present invention, which is seen from an electrode arrangement side.

Next, the LED 10 according to a fourth embodiment will be explained by referring to FIG. 7. FIG. 7 is a plane view of the LED 10 according to the fourth embodiment, which is seen from an electrode arrangement side.

The LED 10 according to the fourth embodiment has an outer shape of approximately a square, and the n-electrode 7 and the p-electrode 8 are arranged on a diagonal line of the square. The protrusions 9 are formed so as to surround an outer periphery of an area where the transparent electrode 6 and the n-electrode 7 are arranged. In addition, the p-electrode is composed of a circular part 8a on which a power supply line is bonded and arm parts 8b (auxiliary electrode) which extend on the transparent electrode 6 from the circular part 8a. The other configuration is identical to the LED 10 according to the first embodiment.

The LED 10 according to the fourth embodiment has a device shape of approximately a square, while disposing the arm parts 8b in the p-electrode 8 to expand a contact area with the transparent electrode 6. With a configuration described above, areas of the transparent electrode 6 in proximity to the p-electrode 8 can be made large and at the same time, distance of areas of the transparent electrode 6, not in proximity to the p-electrode 8, from the p-electrode can be made small, thereby resulting in efficient electric current diffusion on a whole light emitting area. Accordingly, the light emitting efficiency of the LED 10 can be increased.

In addition, when the transparent electrode 6 is thinned, the electric current diffusion in a surface direction is decreased. Therefore, the decrease in the electric current diffusion due to thinning of the transparent electrode 6 can be compensated by disposing the arms 8b and the like as an auxiliary electrode.

Fifth Embodiment

Figure 8:
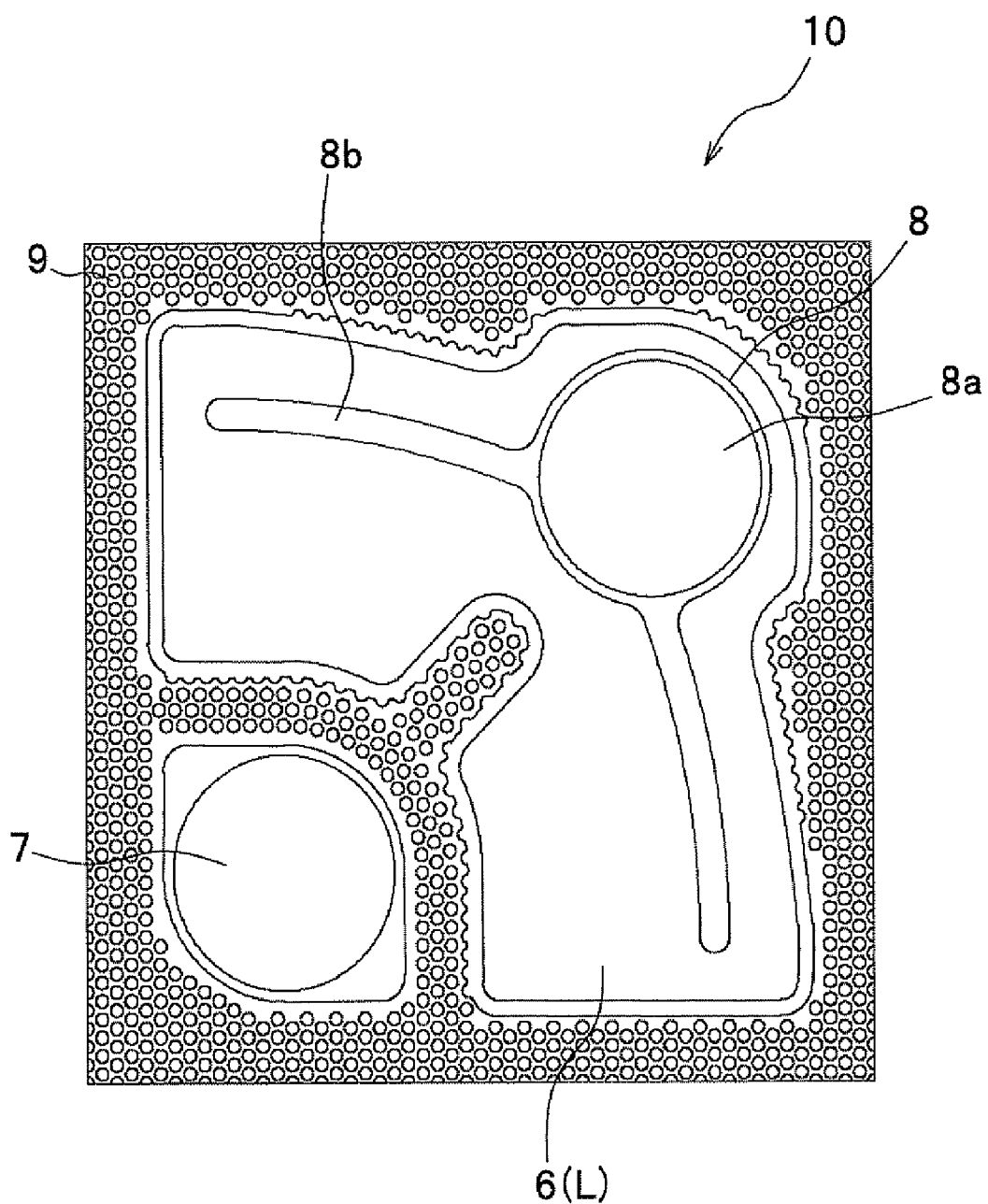
FIG. 8 is a plane view of an LED according to a fifth embodiment of the present invention, which is seen from an electrode arrangement side.

Next, the LED 10 according to a fifth embodiment will be explained by referring to FIG. 8. FIG. 8 is a plane view of the LED 10 according to the fifth embodiment, which is seen from an electrode arrangement side.

The LED 10 according to the fifth embodiment has an identical configuration to that of the LED 10 according to the fourth embodiment except a shape of a semiconductor stack structure in the light emitting area L, a shape of the transparent electrode 6 caused by a change of the shape of the semiconductor stack structure, and an area where the protrusions 9 are arranged.

In the LED 10 according to the fifth embodiment, as the embodiment 4, the p-electrode 8 is composed of the circular part 8a and the arm parts 8b which extend on the transparent electrode 6. In addition, as the third embodiment, when the LED 10 is seen from the electrode arrangement side, the semiconductor stack structure which is formed in the light emitting area L located between the n-electrode 7 and the p-electrode 8 has a constricted part which becomes narrower toward the p-electrode 8 from the n-electrode 7 on a straight line which connects the n-electrode 7 and the p-electrode 8, and a plurality of protrusions 9 are formed on the constricted part. With a structure described above, the light extraction efficiency and controllability of the light orientation can be further increased.

It is noted that a semiconductor stack structure of the LED 10 according to each of the embodiments is not limited to the above configurations. For example, a mixed crystal and a mixed ratio, a stacked layer number, and an order of the stacked layer in each of the semiconductor layers can be designed arbitrarily as needed. The n-electrode 7, the p-electrode 8, the transparent electrode 6, and the insulation film 5 also can be designed arbitrarily with respect to, for example, an order of the stacked layer, the materials to be used, and a film thickness of each of the layers.

As the protrusions and depressions, if a plurality of depressions are formed in the non-light emitting area when the LED 10 is seen from the electrode arrangement side, the depressions are formed of at least not less than 100 pieces, preferably not less than 200 pieces, more preferably not less than 300 pieces, and further more preferably not less than 500 pieces.

In addition, a cross sectional shape of the protrusions and depressions (top shape of protrusion or dimple shape of depression) which is seen from the observation surface direction may be not only a circle, but also various kinds of shapes such as an ellipse, a rhomboid, a triangle, and a hexagon. If an end face (side wall) of the protrusions 9, which is seen from the observation surface direction, intersects with the end face of the light emitting layer 3 at an angle, preferably at right angles, the emitted light can be efficiently extracted outside. Especially, it is preferable if a shape of the protrusion 9 which is seen from the observation surface direction is formed in a triangle, and if one angle of the triangle is faced to the end face of the light emitting layer 3, while positioning one side of the triangle which faces the one angle to be distant from the end face of the light emitting layer 3 and in parallel with the end face of the light emitting layer 3, because the side which faces the end face of the light emitting layer 3 at the angle can be formed to be large. That is, each of the triangles can be arranged in a radial pattern against the end face of the light emitting layer 3 so that one angle of each of the triangles faces the end face of the light emitting layer 3. It is noted that an isosceles triangle or an equilateral triangle is preferable as the triangle. In this case, it is preferable that the one angle described above is an angle which is formed by two sides which have a same length. With the above configuration, a light can be extracted more uniformly.

In addition, for example, a plurality of protrusions 9 may be disposed with a high density in the vicinity of the n-electrode 7 and the light emitting area L where a light emitting intensity is relatively high, and with a low density in an area other than the n-electrode 7 and the light emitting area L where the light emitting intensity is relatively low. A high light emitting intensity area and a low light emitting intensity area vary depending on a structure of the LED 10. In any case, the efficient light extraction and the control of the light orientation can be achieved by varying the density of the plurality of protrusions 9 in consideration of the light emitting intensity.

As described above, a light emitting device according to the embodiments can reduce a light radiated from an end face (side of LED 10) of the light emitting device, and selectively radiates a light in an upward direction (observation surface direction). Especially, in the LED 10 which includes a low refractive index layer in at least one of layers which sandwich the light emitting layer 3 from the top and bottom (preferably upper layer, or p-type semiconductor layer 4 side), a light is likely to be reflected at the low refractive index layer, thereby resulting in propagation mainly in the lateral direction. The present invention is especially effective for this kind of the LED 10.

<Operation of Light Emitting Device>

Operations of the LED 10 according to the second to fifth embodiments will be explained. Since the p-electrode 8 is connected to a positive terminal and the n-electrode 7 is connected to a negative terminal of a direct current power source, thereby since a semiconductor stack structure which configures the LED 10 is applied with a voltage in a forward direction, as with the LED 10 according to the first embodiment, the LED 10 according to the second to fifth embodiments emits a light in the light emitting layer 3 which is disposed in the light emitting area L. Meanwhile, since a light extraction method is identical to that of the first embodiment, the explanation will be omitted.

<Fabrication Method of Light Emitting Device>

Next, fabrication methods of the LED 10 according to the second to fifth embodiments will be explained.

The LED 10 according to the second to fifth embodiments is different from that of the first embodiment with respect to an outer shape of the LED chip, a shape of the semiconductor stack structure in the light emitting area L, a shape of the transparent electrode 6 which is caused by a change of the shape of the semiconductor stack structure, a formation area of the protrusions 9, a shape of the n-electrode 7, a shape of the p-electrode 8, and an arrangement area of each of the members described above. However, the LED 10 can be fabricated with a similar manner to the first embodiment by, for example, appropriately changing a mask pattern in photolithography in the fabrication process of the LED 10 according to the first embodiment depending on the shape and arrangement area of each of the members.

EXAMPLE

Next, an example of LED according to the present invention will be explained.

In the fabrication process shown in FIG. 4B, the first insulation film 5a of 150 nm in thickness was formed. In the fabrication process shown in FIG. 4L, the second insulation film 5b of 200 nm in thickness was formed. Then, the LED 10 shown in FIG. 6 was fabricated. A thickness of the insulation film 5 on the top of the protrusions 9 was 350 nm, and thicknesses of the insulation film 5 on the bottom of the protrusions 9 and on the transparent electrode 6 were 200 nm. In addition, a thickness of the insulation film 5 on the side wall of the protrusions 9 was 100 nm.

As a comparative example, a LED was fabricated by removing the first insulation film 5a. That is, the photoresist mask 21 was not formed on the top of the protrusions 9 in the fabrication process shown in FIG. 4F, and the first insulation film 5a which was formed on the top of the protrusions 9 was removed by RIE in the fabrication process shown in FIG. 4G. The other shapes and fabrication processes were identical to that of the example described above. A thickness of the insulation film 5 on the top of the protrusions 9 was 200 nm, which was identical to thicknesses on the bottom of the protrusions 9 and on the transparent electrode 6. In addition, a thickness of the insulation film 5 on the side wall of the protrusions 9 was 100 nm.

The LED of the example according to the present invention shows an improvement of a light emission output (light emitting efficiency) by 5%, compared with the LED of the comparative example.

What is claimed is:

1. A light emitting device, comprising:
   a substrate;
   an n-type semiconductor layer which is composed of a nitride semiconductor, formed on the substrate and has an n-side electrode;
   a p-type semiconductor layer which is composed of a nitride semiconductor, and stacked above the n-type semiconductor layer;
   a light emitting layer which is disposed between the n-type semiconductor layer and the p-type semiconductor layer;
   a p-side electrode which is disposed on a transparent electrode formed on the p-side electrode in a light emitting area,
   a plurality of protrusions and depressions in an area other than the light emitting area; and
   an insulation film on an area except areas of the n-side electrode and the p-side electrode,
   wherein the n-side electrode and the p-side electrode are arranged on a same side of the substrate,
   wherein a thickness of the insulation film on a top of the protrusions and depressions is thicker than a thickness of the insulation film in the light emitting area.

2. The light emitting device according to claim 1,
   wherein a height of the top of the protrusions and depressions from an upper surface of the substrate is higher than a height of the light emitting layer from the upper surface of the substrate.

3. The light emitting device according to claim 1,
   wherein the insulation film on the top of the protrusions and depressions has a stacked structure which is configured by stacking a first insulation film which is formed on the p-type semiconductor layer and a second insulation film which covers the first insulation film.

4. The light emitting device according to claim 1,
   wherein a height of a bottom of the protrusions and depressions from an upper surface of the substrate is lower than a height of the light emitting layer from the upper surface of the substrate.

5. The light emitting device according to claim 1,
   wherein a cross section of a protrusion configuring the protrusions and depressions is a trapezoid which gradually becomes narrower toward a p-type semiconductor layer side from an n-type semiconductor layer side.

6. The light emitting device according to claim 1,
   wherein when the device is seen from an electrode arrangement side, the plurality of protrusions and depressions are disposed between at least the light emitting area and the n-side electrode.

7. The light emitting device according to claim 1,
   wherein when the device is seen from the electrode arrangement side, a semiconductor stack structure which is formed in the light emitting area which is located between the n-side electrode and the p-side electrode has a constricted part which extends from an n-side electrode side on a straight line which connects the n-side electrode and the p-side electrode,
   wherein the constricted part is provided with the plurality of protrusions and depressions.

8. A light emitting device, comprising:
   a substrate;
   an n-type semiconductor layer which is composed of a nitride semiconductor, formed on the substrate and has an n-side electrode;
   a p-type semiconductor layer which is composed of a nitride semiconductor, and stacked above the n-type semiconductor layer;
   a light emitting layer which is disposed between the n-type semiconductor layer and the p-type semiconductor layer;
   a p-side electrode which is disposed on a transparent electrode formed on the p-side electrode in a light emitting area,
   a plurality of protrusions and depressions on an area other than the light emitting area; and
   an insulation film on an area except areas of the n-side electrode and the p-side electrode,
   wherein the n-side electrode and the p-side electrode are arranged on a same side of the substrate,
   wherein a thickness of the insulation film on a top of the protrusions and depressions is thicker than thicknesses of the insulation film on a bottom and on a side wall of the protrusions and depressions.

9. The light emitting device according to claim 8,
   wherein a height of the top of the protrusions and depressions from an upper surface of the substrate is higher than a height of the light emitting layer from the upper surface of the substrate.

10. The light emitting device according to claim 8,
    wherein the insulation film on the top of the protrusions and depressions has a stacked structure which is configured by stacking a first insulation film which is formed on the p-type semiconductor layer and a second insulation film which covers the first insulation film.

11. The light emitting device according to claim 8,
    wherein a height of a bottom of the protrusions and depressions from an upper surface of the substrate is lower than a height of the light emitting layer from the upper surface of the substrate.

12. A light emitting device, comprising:
    a substrate;
    an n-type semiconductor layer which is composed of a nitride semiconductor, formed on the substrate and has an n-side electrode;
    a p-type semiconductor layer which is composed of a nitride semiconductor, and stacked above the n-type semiconductor layer;
    a light emitting layer which is disposed between the n-type semiconductor layer and the p-type semiconductor layer;
    a p-side electrode which is disposed on a transparent electrode formed on the p-side electrode in a light emitting area,
    a plurality of protrusions and depressions in an area other than the light emitting area; and
    an insulation film on an area except areas of the n-side electrode and the p-side electrode, wherein the n-side electrode and the p-side electrode are arranged on a same side of the substrate, wherein a thickness of the insulation film on a top of the protrusions and depressions is thicker than thicknesses of the insulation film in the light emitting area and on a bottom and on a side wall of the protrusions and depressions.

13. The light emitting device according to claim 12, wherein a height of the top of the protrusions and depressions from an upper surface of the substrate is higher than a height of the light emitting layer from the upper surface of the substrate.

14. The light emitting device according to claim 12, wherein the insulation film on the top of the protrusions and depressions has a stacked structure which is configured by stacking a first insulation film which is formed on the p-type semiconductor layer and a second insulation film which covers the first insulation film.

15. The light emitting device according to claim 12, wherein a height of a bottom of the protrusions and depressions from an upper surface of the substrate is lower than a height of the light emitting layer from the upper surface of the substrate.

* * * * *